United States Patent [19]

Matsuda et al.

[11] Patent Number: 5,571,749
[45] Date of Patent: Nov. 5, 1996

[54] METHOD AND APPARATUS FOR FORMING DEPOSITED FILM

[75] Inventors: Koichi Matsuda, Nara; Takaharu Kondo; Yusuke Miyamoto, both of Tsuzuki-gun, all of Japan

[73] Assignee: Canon Kabushiki Kaisha, Tokyo, Japan

[21] Appl. No.: 365,244

[22] Filed: Dec. 28, 1994

[30] Foreign Application Priority Data

Dec. 28, 1993 [JP] Japan .................................. 5-337467
Dec. 22, 1994 [JP] Japan .................................. 6-320034

[51] Int. Cl.$^6$ .................................................. H01L 31/20
[52] U.S. Cl. .................... 437/113; 437/4; 437/101; 136/258; 427/573; 427/574; 427/575; 427/578; 118/718; 118/719; 118/723 R; 118/723 MW; 118/723 E; 118/724; 118/725
[58] Field of Search .................. 437/4, 101, 108–109, 437/113; 427/574–575, 578, 573; 118/718–719, 723 R, 723 MP, 723 MW, 723 E, 724–725; 136/258 AM

[56] References Cited

U.S. PATENT DOCUMENTS

| | | | |
|---|---|---|---|
| 4,389,970 | 6/1983 | Edgerton | 118/666 |
| 4,400,409 | 8/1983 | Izu et al. | 437/173 |
| 4,470,369 | 9/1984 | Edgerton | 118/723 |
| 4,951,602 | 8/1990 | Kanai | 118/719 |
| 5,258,075 | 11/1993 | Kurokawa | 118/719 |
| 5,510,151 | 4/1996 | Matsuyama | 427/509 |

FOREIGN PATENT DOCUMENTS

| | | | |
|---|---|---|---|
| 62-7172 | 1/1987 | Japan | 136/258 AM |
| 62-25465 | 2/1987 | Japan | 136/258 AM |

OTHER PUBLICATIONS

Patent Abstracts of Japan, vol. 9, No. 69 (E–305) Mar. 29, 1985.
Patent Abstracts of Japan, vol. 10, No. 87 (E–393) Apr. 5, 1986.
Guha et al., "A Novel Design for Amorphous Silicon Alloy Solar Cells," (20th IEEE PV SEC, 1988) pp. 79–84.

*Primary Examiner*—Aaron Weisstuch
*Attorney, Agent, or Firm*—Fitzpatrick, Cella, Harper & Scinto

[57] ABSTRACT

A plasma CVD method adapted to a roll-to-roll process or the like wherein the change rate of the temperature of the substrate before and after an i-type semiconductor layer is deposited is made rapid so as to prevent diffusion of impurities occurring due to annealing, by constituting the apparatus structure in such a manner that the deposited film is formed on an elongated substrate by the plasma CVD method while heating the elongated substrate moving in an i-layer forming discharge chamber at a rate of 4° C./second or higher immediately in front of an inlet to the discharge chamber and cooling the same at a rate of 4° C./second or higher immediately at the outlet of the discharge chamber so that a stacked-layer type photovoltaic device having a large area and free from scattering of the characteristics is continuously formed without deterioration of the characteristics occurring due to dopant diffusion.

49 Claims, 12 Drawing Sheets

METHOD AND APPARATUS FOR FORMING DEPOSITED FILM

BACKGROUND OF THE INVENTION

1. Field of the Invention

The present invention relates to a method and an apparatus for continuously forming deposited films on an elongated substrate by a plasma CVD method. More particularly, the present invention relates to a method and an apparatus for forming deposited films suitable to mass-produce devices, such as solar cells or sensors, that are photoelectric conversion devices using an amorphous semiconductor which is a non-single-crystalline (non-monocrystalline) semiconductor, or a microcrystal semiconductor.

2. Related Background Art

In recent years, consumption of electric power has rapidly increased all over the world and electric power production has increased correspondingly. However, it leads to the problems that thermal power generation and nuclear electric power generation cause environmental pollution and global warming. On the other hand, solar cell power generation using sunlight does not raise the foregoing problems of environmental pollution, global warming, and maldistribution of resources. Therefore, solar cell power generation is worthy of consideration for meeting a further large requirement for electric power.

To realize large scale solar cell power generation, solar cells must have a satisfactory photoelectrical conversion efficiency and stable characteristics while being suitable to mass production so as to be supplied cheaply. Furthermore, solar cells having a large area are required because of the large scale of the required power generation. Therefore, it has been proposed that an amorphous silicon type solar cell be formed by depositing a semiconductor thin film, such as of amorphous silicon, which is a non-single-crystal material, on a relatively low cost substrate, such as glass or a metal sheet, by decomposing a readily available raw material gas of silane or the like by glow discharge. The amorphous silicon type solar cell exhibits excellent mass productivity and lower cost as compared with a solar cell manufactured from single-crystal silicon, thus attracting attention. A variety of manufacturing methods have thus far been proposed.

The solar cell power generation system usually has a structure wherein modules formed of a plurality of solar cells, are connected in series or in parallel so that a desired electric current and voltage are obtained. Therefore, disconnections and short circuits in each unit module must be prevented. Furthermore, nonuniformity of the output voltage and electric currents of the unit modules must be prevented. To meet these requirements, the characteristics of the semiconductor, which are the most important factor determining the characteristics of the module, must have uniformity. To simplify the process for assembling the module, a deposited film of a semiconductor must be formed over a large area and must have excellent characteristics. The mass productivity of the solar cell thereby can be improved and the manufacturing cost can be significantly reduced.

The semiconductor, which is the most important component of the solar cell, includes semiconductor junctions, such as p-n junctions, p-i-n junctions or the like. The foregoing semiconductor junctions can be formed by sequentially depositing semiconductors having different conductivity types, or by implanting into a semiconductor having a certain conductivity type dopants having a different conductivity type or by thermal diffusion of dopants. When an amorphous silicon solar cell is manufactured, the following known method is employed which includes the steps of mixing a raw material gas containing elements as dopants such as phosphine ($PH_3$), diborane ($B_2H_6$) or the like with a silane gas or the like which is the main raw material gas; decomposing the mixed raw material gases by glow discharge to form semiconductor films having desired conductivity types; and sequentially depositing the thus-obtained semiconductor films on a desired substrate to form a semiconductor junction. Therefore, when the amorphous silicon solar cell is manufactured, interdiffusion of dopants having different conductivity types is generally prevented by providing independent film forming chambers corresponding to the semiconductor layers to be formed.

As a method of forming a deposited film by a plasma CVD method suitable to manufacture an amorphous silicon solar cell of the foregoing type, a roll-to-roll method has been disclosed in U.S. Pat. No. 4,400,409. The foregoing film forming method comprises the steps of disposing a plurality of glow discharge regions along the path of an elongated (belt-like) substrate, and continuously conversing the elongated substrate in its longitudinal direction while forming semiconductor layers respectively having desired conductivity types in the corresponding glow discharge regions. According to the above patent, solar cells having desired semiconductor junctions can be formed continuously. The foregoing method of forming deposited films has a structure for preventing interdiffusion and mixture of the dopant gas for use in each glow discharge region into other glow discharge regions, the structure being arranged such that the respective glow discharge regions are mutually separated from one another by slit-like separation passages called gas gates and that gas flows of, for example Ar or $H_2$, are formed to flow through the separation passages. As a result of employing the above structure, the roll-to-roll method for forming a deposited film is suitable to manufacture the semiconductor layers for the solar cell or the like.

On the other hand, it is known that the photoelectric conversion efficiency of the amorphous silicon solar cell can be improved when a Group IV alloy semiconductor, such as a-SiGe:H, a-SiGe:F, a-SiGe:H:F, a-SiC:H, a-SiC:F or a-SiC:H:F is used as the i-type (intrinsic type) semiconductor by continuously changing the forbidden band gap (Egopt) of the i-type semiconductor in the direction of the thickness from the light incident side to improve the open circuit voltage (Voc) and fill factor (FF) of the solar cell (20th IEEE PVSC, "A Novel Design for Amorphous Silicon Solar Cells", S. Guha, J. Yang, et al.).

Hitherto, the process for continuously forming a deposited film having a large area involves diffusion of impurities into the i-type semiconductor due to an increase in the substrate temperature and thus the characteristics of the solar cell are deteriorated. In order to overcome the problem above, a method has been employed in which the substrate temperature is sequentially lowered as the respective semiconductor layers are deposited during the step of depositing the films. However, the conventional method cannot form a deposited film at a substrate temperature suitable for each deposited film. Therefore, the characteristics of the deposited film are not satisfactory. Therefore, a problem has occurred in that the characteristics of the photoelectric conversion device formed by depositing a plurality of layers have been unsatisfactory.

The foregoing roll-to-roll method for forming a deposited film has an arrangement wherein the elongated substrate is continuously moved while forming the film. Therefore, improvement in the manufacturing efficiency requires the moving speed of the elongated substrate and the film deposition speed to be increased. However, increasing the speeds leads to deterioration of the characteristics of the photoelectric conversion device.

The film quality of the semiconductor layer having the i-type conductivity must be improved when the characteristics of the photoelectric conversion device are to be improved. However, additional electric power is required to increase the substrate temperature or the bias electric power.

However, the additional electric power raises the substrate temperature excessively, and impurities are undesirably diffused into the i-type semiconductor due to annealing of the deposited films. Therefore, it is difficult to improve the characteristics of the photoelectric conversion device by the foregoing roll-to-toll method.

As disclosed in the U.S. Pat. Nos. 4,389,970 and 4,470,369, the foregoing roll-to-roll method for forming a deposited film controls the substrate temperature at a predetermined level during formation of the deposited film. Therefore, it does not include the idea of changing the substrate temperature at a predetermined rate before and after forming a deposited film so as to prevent annealing of the deposited film.

SUMMARY OF THE INVENTION

An object of the present invention is to provide a process for forming a deposited film which comprises changing a substrate temperature at a predetermined rate before and after forming a deposited film to preventing undesirable annealing of the semiconductor, thereby continuously and uniformly forming a photoelectric conversion device exhibiting an excellent conversion efficiency on a substrate having a large area.

According to one aspect of the present invention, there is provided a process for forming a deposited semiconductor film by glow discharge on a continuously moving belt-like substrate, which comprises the steps of: heating the substrate immediately before it enters the glow discharging region; forming a deposited film on the substrate in the glow discharging region; and cooling the substrate immediately after it passes through the glow discharging region.

According to another aspect of the present invention, there is provided a process for continuously forming a deposited film on an elongated substrate in a vacuum chamber by plasma CVD, which comprises the steps of: continuously moving the substrate in a lengthwise direction in the vacuum chamber, while heating the substrate immediately before entering the inlet of the glow discharge region in the vacuum chamber at a rate of 4° C./second or higher, forming a semiconductor layer on the substrate in the glow discharge region at a deposition rate of 0.1 nm/second to 20 nm/second by plasma CVD, and cooling the substrate at a rate of 4° C./second or higher immediately after exiting the outlet of the glow discharge region.

As a result, the present invention is able to overcome the foregoing problems.

DESCRIPTION OF THE PREFERRED EMBODIMENTS

Figure 1:
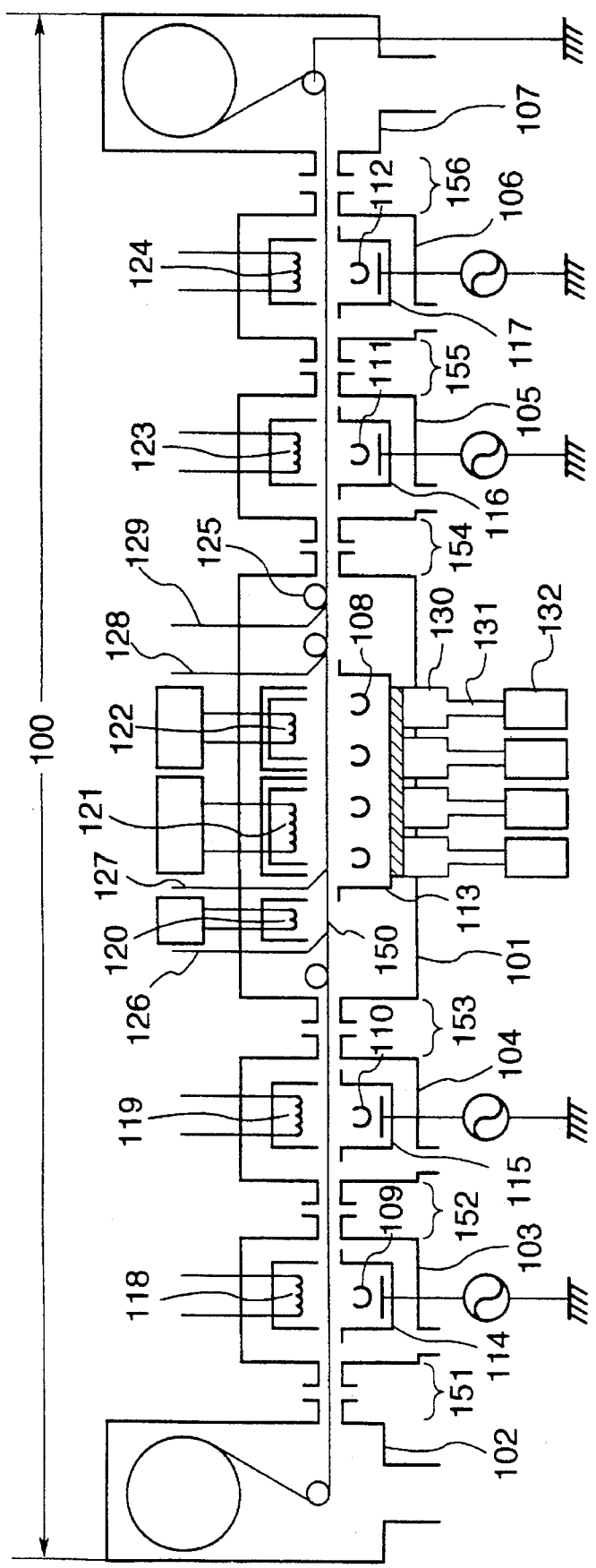
FIG. 1 is a schematic view which illustrates an apparatus for forming a deposited film according to an embodiment of the present invention.

The present invention will now be described.

When a semiconductor solar cell having p-type or n-type conductivity film layers in a p-i-n structure is annealed at a temperature higher than that of the substrate during film formation, dopant atoms such as boron or the like in the semiconductor layer having p-type conductivity (hereinafter referred to as "p-type layer") and dopant atoms such as phosphorus or the like in the semiconductor layer having n-type conductivity (hereinafter referred to as "n-type layer") diffuse into the semiconductor layer having i-type conductivity (hereinafter referred to as "i-type layer"). The foregoing fact is the cause of the deterioration of characteristics of solar cells formed by depositing a plurality of p-i-n structures. The inventors of the present invention have determined that the amount of diffusion of boron atoms in a semiconductor having p-type conductivity and atoms such a phosphorus or the like in a semiconductor having n-type conductivity into the i-type layer can be prevented by rapidly changing the substrate temperature during deposition of the n-type layer to the substrate temperature during deposition of the i-type layer, for example, deposition at the i-type layer temperature of the substrate when both temperatures are different from each other. Although the mechanism of this phenomenon has not been clarified yet, it can be considered that the rapid temperature change causes a kind of a non-equilibrium state to occur (where the equilibrium state means a state in which impurities in the p-type layer or the n-type layer are diffused into the i-type layer due to heat or the like and no density distribution takes place). As a result, the diffusion of impurity atoms can be prevented even when the film forming temperature is raised. In particular, amorphous silicon semiconductor comprises hydrogen atoms which relate to the diffusion of impurities. The rapid temperature change causes a certain kind of a non-equilibrium state to occur between the structure having silicon atoms, the diffusion of hydrogen atoms, and the diffusion of impurity atoms so that the diffusion of impurities is prevented.

Therefore, even if the deposition temperature for the i-type layer in a case that a film forming temperature during deposition of the n-type layer is moderately changed to that during deposition of the i-type layer which is higher than the deposition temperature for the i-type layer in the case where the film forming temperature during deposition of the n-type layer is rapidly changed to that during deposition of the i-type layer, it can be said that the deposited film subjected to the rapid temperature change is relatively free from the deposition of the impurities.

The present invention is based on the foregoing. In order to effectively use the foregoing, a further study was made, thus resulting in knowledge that diffusion of impurities between semiconductor layers can be effectively prevented by causing rapid temperature change to occur between deposited layers and then forming a deposited film at a high deposition speed. It is preferable for the present invention that the rate of change of the temperature of the substrate is 4° C./second or higher. The optimum deposition speed capable of effectively utilizing the rapid temperature change is 0.1 nm/second to 20 nm/second.

Furthermore, it is preferable for the present invention that the difference in the temperatures of the substrate between the deposited layers is large. It is preferable for performing the rapid temperature change that the difference in the temperature between the deposited layers is large. The preferred difference between the temperatures of the substrate for respective deposited layers is 10° C. to 300° C.

Substrate

The preferred material for the substrate according to the present invention is required to be free from deformation and distortion at a temperature required to form the deposited layer and have a desired strength and conductivity. Specifically, the preferred material is exemplified by a thin metal film of stainless steel, aluminum, aluminum alloy, iron, iron alloy, copper, copper alloy, and their combinations; a thin film of any of the foregoing whose surface is coated with another metal thin film and/or an insulating thin film, such as $S1O_2$, $Si_3N_4$, $Al_2O_3$, AlN or the like by sputtering, evaporation, or plating; a heat resistant resin sheet of polyimide, polyamide, polyethylene terephthalate, epoxy resin or the like; or a composite of any of the foregoing heat resistant resins and glass fiber, carbon fiber, boron fiber, metal fiber or the like whose surface is subjected to a conductive treatment with metal material, an alloy, and a transparent conductive oxide by plating, evaporation, sputtering, etc.

It is preferable that the thickness of the substrate is minimized in terms of cost reduction and space savings as long as the strength capable of maintaining a curved shape when the substrate is moved can be obtained. Specifically, the thickness can be 0.01 mm to 5 mm, preferably, 0.02 mm to 2 mm, and most preferably 0.05 mm to 1 mm. In the case where the metal thin film is used, a desired strength can easily be obtained even if the thickness is relatively thin.

The width of the substrate is not particularly limited, the width being determined based on the size of the vacuum chamber or the like.

The length of the substrate is not particularly limited. The substrate may have a length which allows the substrate to be wound into a roll form or a length obtained by welding together a plurality of elongated substrates.

In this embodiment the substrate is heated and cooled in a short time. Since it is unsatisfactory for the temperature distribution to occur in the lengthwise direction of the substrate, it is preferable that the heat conduction be minimized in the direction in which the substrate is moved. To cause the temperature of the substrate to respond to heating and cooling, it is preferable that the heat conduction be good in the direction of the thickness of the substrate.

The heat conduction in the moving direction can be limited and made large in the direction of the thickness of the substrate by reducing the thickness. In a case where the substrate has a uniform thickness, it is preferable that (heat conduction)×(thickness) be $1\times10^{-1}$ W/K or less, and more preferable $1\times10^{-1}$ W/K or less.

Methods for Heating and Cooling the Substrate

In the present invention, a substrate may be heated and cooled by heat conduction, wherein a means for heating and cooling the substrate is brought into contact with the substrate, or by heat radiation wherein the means for heating and cooling the substrate is positioned away from the substrate. The substrate may be heated and cooled from the surface on which the deposited film is formed or from the reverse side. The specific heat, the heat conductivity and the moving speed of the substrate are considered to control the temperature distribution of the heating and cooling of the substrate for the purpose of obtaining a desired rate of change of the substrate temperature. When a means for heating and cooling the substrate that is moved together with the substrate is used to control the substrate temperature, the temperature to be controlled by the means for heating and cooling the substrate is changed in accordance with the movement of the substrate.

As specific means for heating the substrate, heating by a heater such as a halogen lamp, a resistance heating member or the like, contact with a hot gas plasma, or inductive heating by means of electromagnetic waves may be employed. As specific means for cooling the substrate, cooling by radiating heat to a cooling member cooled by air or water, or by spray of cold gas may be employed.

Figure 11A:
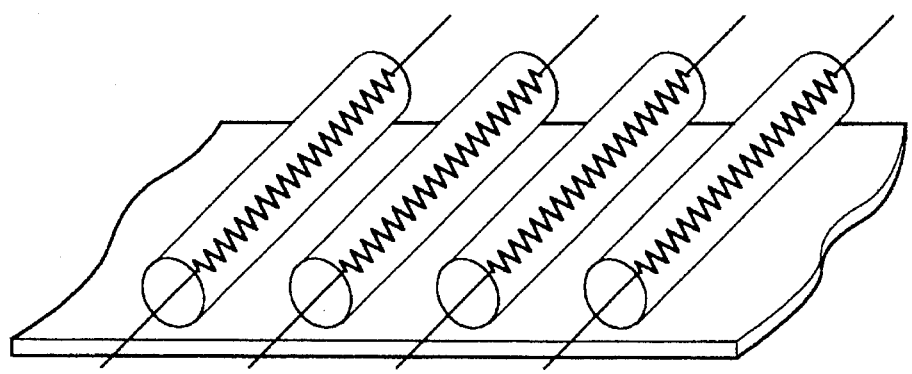
FIGS. 11A to 11C are schematic views which illustrate a heating means for heating a substrate according to the present invention.
Figure 11B:
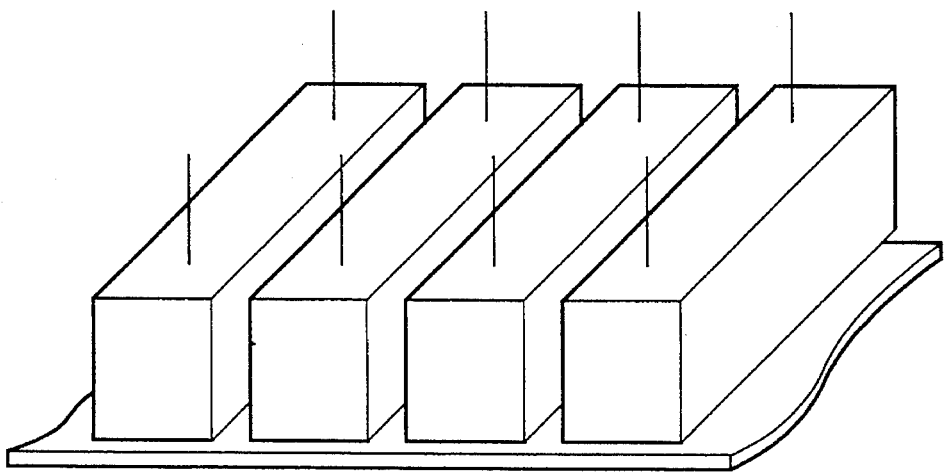
Figure 11C:
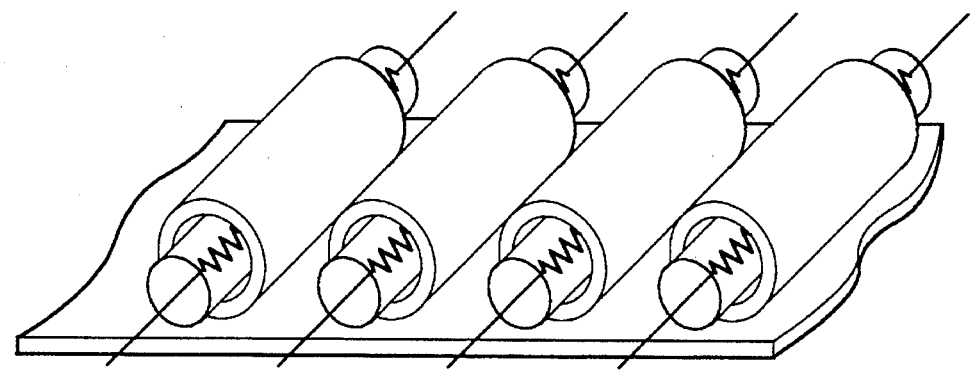
Figure 12A:
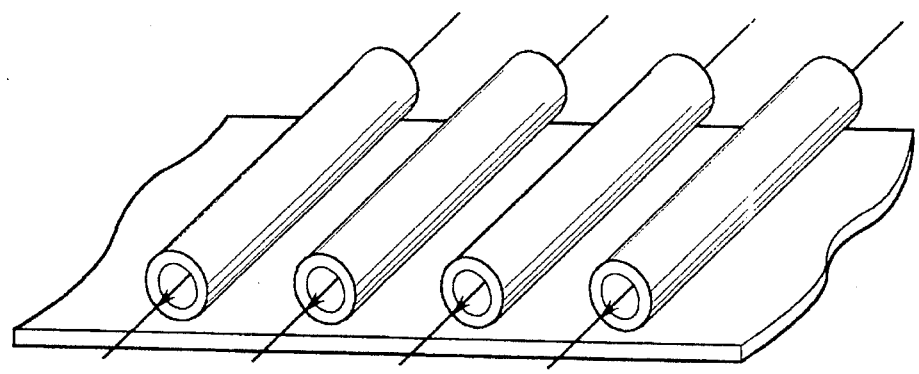
FIGS. 12A to 12C are schematic views which illustrate a cooling means for cooling a substrate according to the present invention.
Figure 12B:
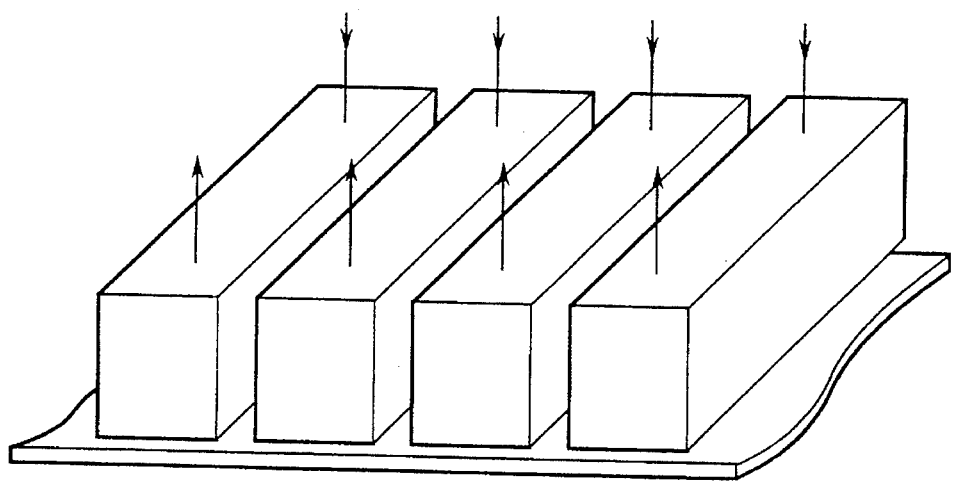
Figure 12C:
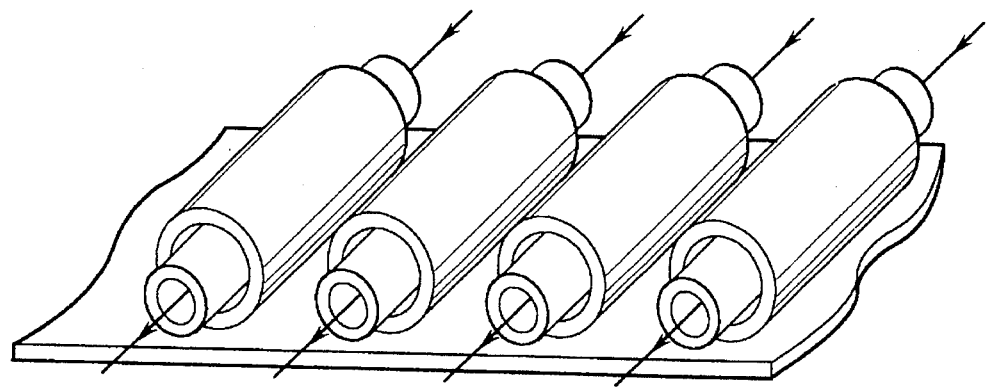

FIGS. 11A to 11C are schematic views which illustrate examples of methods for heating a substrate. FIG. 11A illustrates infrared radiant heating using halogen lamps, FIG. 11B illustrates heating by bringing a heating block into contact with a substrate, and FIG. 11C illustrates heating by bringing a heating roller into contact with a substrate. FIGS. 12A to 12C are schematic views which illustrate examples of a method for cooling the substrate. FIG. 12A illustrates cooling by using a cooling pipe which is disposed adjacent to the substrate and through which a heat transfer medium, such as water passes through as a cooling medium, FIG. 12B illustrates cooling by bringing a cooling medium such as a block of water or the like, into contact with the substrate, and FIG. 12C illustrates cooling by bring a cooling medium, such as a roller of water or the like, into contact with the substrate.

The present invention will now be described with reference to the drawings.

A continuous deposited film-forming apparatus 100 shown in FIG. 1 is suitable to form a semiconductor having an n-i-p junction on an elongated (belt-like) substrate 150. The continuous deposited film-forming apparatus 100 comprises a substrate feeding chamber 102, an n-type layer-forming vacuum chamber 103, an RF i-type (n-side) layer-forming vacuum chamber 104, an MW i-type layer-forming vacuum chamber 101, an RF i-type (p-side) layer-forming vacuum chamber 105, a p-type layer-forming vacuum chamber 106 and a substrate winding chamber 107 that are connected in series by six gas gates 151, 152, 153, 154, 155, and 156. A gate gas supply pipe for supplying a gate gas is connected to each of the gas gates 151, 152, 153, 154, 155, and 156.

The substrate feeding chamber 102 stores the elongated substrate 150 for supply to the substrate winding chamber 107. A bobbin, around which the elongated substrate 150 is wound, is mounted in the substrate feeding chamber 102. Furthermore, the substrate feeding chamber 102 has conveyance rollers for supporting and conveying the elongated substrate 150, while a substrate feeding mechanism for feeding the elongated substrate 150 and an exhaust pipe connected to an exhaust means (not shown) are connected to the substrate feeding chamber 102.

The MW i-type layer-forming vacuum chamber 101 comprises a substantially cubical vacuum chamber and a discharge chamber 113 disposed in the vacuum chamber. The vacuum chamber 101 and the discharge chamber 113 are made of metal and are electrically grounded. The elongated substrate 150, on which the deposited film will be formed, is allowed to pass through the left portion of the vacuum chamber 101 in the drawing, that is, the gas gate 153 attached to the side wall of the inlet portion of the vacuum chamber 101, the elongated substrate 150 being then introduced into the vacuum chamber 101. Then, the elongated substrate 150 is allowed to pass through the discharge chamber 113 and conveyed out of the vacuum chamber 101 through the right-hand portion of the vacuum chamber 101 in the drawing, that is, the gas gate 154 attached to the side wall of the outlet portion of the vacuum chamber 101. A gate gas supply pipe (not shown) for supplying a gate gas is connected to each of the gas gates 153 and 154. The elongated substrate 150 is continuously moved through the vacuum chamber 101 from the gas gate 153 toward the gas gate 154.

In the vacuum chamber 101, there are disposed an infrared-ray lamp 120 for heating the elongated substrate 150, which is moved continuously, prior to entering into the discharge chamber 113, infrared-ray lamp heaters 121 and 122 for heating the elongated substrate 150 immediately after entering the discharge chamber 113, and water cooling pipes 125 for cooling the elongated substrate 150 immediately after passing the outlet of the discharge chamber 113, each of the foregoing units being controlled by a corresponding temperature control unit (not shown). Furthermore, thermocouples 126, 127, 128, and 129 for measuring the substrate temperature at predetermined positions in the vacuum chamber 101 are disposed in contact with the back side of the elongated substrate 150. When the thermocouple is disposed "immediately before" the inlet of the discharge chamber 113 means it is disposed within 1 cm and when it is disposed "in the vicinity of" the inlet of the discharge chamber 113 means it is disposed at a distance of about 10 cm from the inlet.

The discharge chamber 113 includes gas introduction pipes 108 for introducing a raw material gas for the deposited film from a gas supply system (not shown). An exhaust pipe connected to an exhaust unit (not shown) is attached to the wall of the vacuum chamber 101 on the rear side in the drawing. Microwave introduction windows 130 are arranged on the wall of the discharge chamber 113, that faces the elongated substrate 150, in the direction in which the elongated substrate 150 is moved. The windows 130 introduce microwave energy into the discharge chamber 113 and each is connected to an end of a microwave introduction pipe 131, the other end of which is connected to a microwave power source 132. Portions of each window 130 attached to the discharge chamber 113 are made of a microwave-transmissive material such as quartz, alumina ceramic, or the like.

The vacuum chambers 103, 106, 104, and 105 for respectively forming n-type, p-type, RF i-type (n-side) and RF i-type (p-side) layers have the same structures so that n-type, p-type, i-type and i-type semiconductor layers respectively are formed. An exhaust pipe connected to an exhaust means (not shown) is attached to each vacuum chamber. Each of the vacuum chambers 103, 106, 104, and 105 respectively have discharge chambers 114, 117, 115, and 116 therein. The discharge chambers 114, 117, 115, and 116 include respective gas introduction pipes 109, 112, 110, and 111, a discharge electrode connected to a high frequency power source, and respective infrared-ray lamp heaters 118, 124, 119, and 123 for heating the moving elongated substrate 150.

The substrate winding chamber 107 winds up the elongated substrate 150 on which the deposited film has been formed, the substrate winding chamber 107 having a similar structure to that of the substrate feeding chamber 102 such that an exhaust pipe is connected to the substrate winding chamber 107 and a substrate winding bobbin and substrate conveying rollers are disposed for winding up the elongated substrate 150 onto the bobbin.

The operation of the continuous deposited film-forming apparatus 100 will now be described mainly in a case where a semiconductor having an n-i-p junction is formed.

Initially, the elongated substrate 150 is arranged between the substrate feeding chamber 102 and the substrate winding chamber 107 so as to be moved continuously at a predetermined speed. Then, gases are evacuated from the substrate feeding chamber 102, the vacuum chambers 103, 106, 104, 105, and 101 for respectively forming n-type, p-type, RF i-type (n-side), RF i-type (p-side) and MW i-type layers and the substrate winding chamber 107 to obtain a predetermined degree of vacuum. Then, gate gases are supplied to the gas gates 151, 152, 153, 154, 155 and 156.

Then, in the MW i-type layer-forming vacuum chamber 101, the infrared-ray lamp heaters 120, 121, and 122 and the water cooling pipes 125 are operated while monitoring the outputs from the thermocouples 126 to 129 so that the moving elongated substrate 150 is heated and cooled to obtain a predetermined temperature distribution in the discharge chamber 113. While introducing the raw material gas for forming the deposited film into the discharge chamber 113 through the gas introduction pipes 108, microwave electric power is introduced through the microwave introduction windows 130. Thus, a microwave glow discharge takes place in the discharge chamber 113, causing plasma to be generated. As a result, a deposited film is formed on the moving elongated substrate 150.

In the case where a semiconductor layer for manufacturing a photovoltaic device according to the present invention is formed by microwave plasma CVD, the preferred conditions are as follows: the substrate temperature in the deposition chamber is 100° C. to 450° C., the internal pressure in the deposition chamber is 0.5 mTorr to 30 mTorr, the microwave power is 0.01 W/cm$^3$ to 1 W/cm$^3$, and the frequency of the microwave is 0.5 GHz to 10 GHz.

To improve the characteristics of the semiconductor layer for a photovoltaic device, high frequency bias electric power is sometimes introduced into the microwave glow discharge region in the discharge chamber 113. The introduction of the high frequency bias further activates active species in the glow discharge region so that the substrate is annealed. As a result, boron atoms in the p-type layer and the phosphorus atoms in the n-type layer diffuse into the i-type layer, causing the characteristics of a solar cell to be deteriorated. Therefore, it is preferable that the deposition speed by 0.2 nm/second or higher in the case where a semiconductor layer is deposited by microwave plasma CVD.

The elongated substrate 150 is heated immediately before the inlet of the discharge chamber 113 by the infrared-ray lamp heater 120, while it is cooled by the cooling pipes 125 immediately after the outlet of the discharge chamber 1130 Therefore, the rate of change of the substrate temperature can be changed arbitrarily before and after the deposited film is formed.

Also in the n-type, p-type, RF i-type (n-side) and RF i-type (p-side) layer-forming vacuum chambers 103, 106, 104, and 105, raw material gases for forming the deposited film are introduced into the discharge chambers 114, 117, 115, and 116 through the corresponding gas introduction pipes 109, 112, 110, and 111. Then, high frequency electric power is supplied from the high frequency power source to the discharge electrode so that high frequency glow discharge is caused between the discharge electrode and the grounded conductive substrate 150 and thus plasma is generated.

In the case where the deposition is performed by high frequency plasma CVD, the preferred conditions are as follows: the substrate temperature in the deposition chamber is 100° C. to 350° C., the internal pressure in the deposition chamber is 0.1 Torr to 10 Torr, the RF power is 0.01 W/cm$^2$ to 5.0 W/cm$^2$, and the deposition rate is 0.1 A/second to 30 A/second.

As a result, the raw material gases in the discharge chambers 114, 117, 115, and 116 are decomposed so that a deposited film is formed on the elongated substrate 150.

Since the elongated substrate 150 is moved continuously through n-type, p-type, RF i-type (n-side) and RF i-type (p-side) layer-forming vacuum chambers, a semiconductor having an n-i-p junction is formed on the substrate 150.

Since the raw material gas for the deposited film is introduced through the gas introduction pipe and is exhausted through the exhaust pipe disposed on the wall on the opposite side of the discharge chamber, substantially no raw material gas flows in the discharge chamber in the direction of the moving substrate. Thus, the degree of decomposition of the raw material gas is substantially uniform in the direction of the moving substrate. Therefore, variation in the band gap of the deposited film depending on the degree of the decomposition of the raw material gas in the direction of the moving substrate can be prevented.

Examples will now be described specifically with reference to experimental data. Since the experimental examples to be described were performed in the case where the process for forming a deposited film according to the present invention is employed to manufacture an amorphous silicon solar cell or to form an amorphous silicon semiconductor film which is an element of the solar cell, the amorphous silicon solar cell will now be described with reference to FIGS. 6 to 10.

Figure 6:
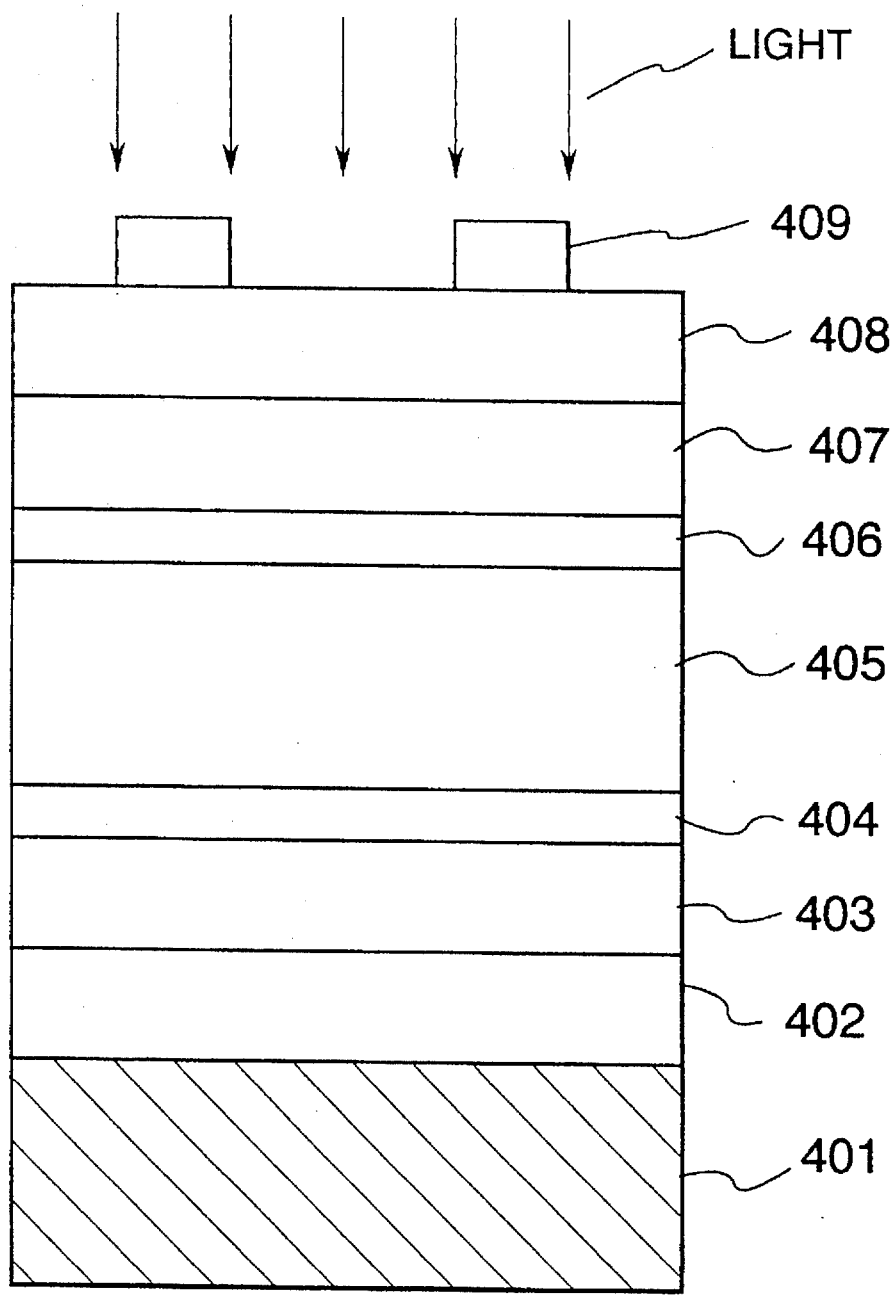
FIG. 6 is a schematic view showing the structure of a solar cell which is a photovoltaic device.

A solar cell, which is a photoelectric conversion device, shown in FIG. 6 has a structure comprising a second or lower electrode 402, an n-type semiconductor 403, an RF i-type (n-side) semiconductor 404, an MW i-type semiconductor 405, an RF i-type (p-side) semiconductor 406, a p-type semiconductor 407, a transparent electrode 408, and a collecting electrode 409 sequentially formed on a substrate 401. The foregoing solar cell is intended to receive incident light from the side of the transparent electrode 408. The second or lower electrode 402 is an electrode opposed to the transparent electrode 408 through the semiconductors 403 to 407.

Figure 7:
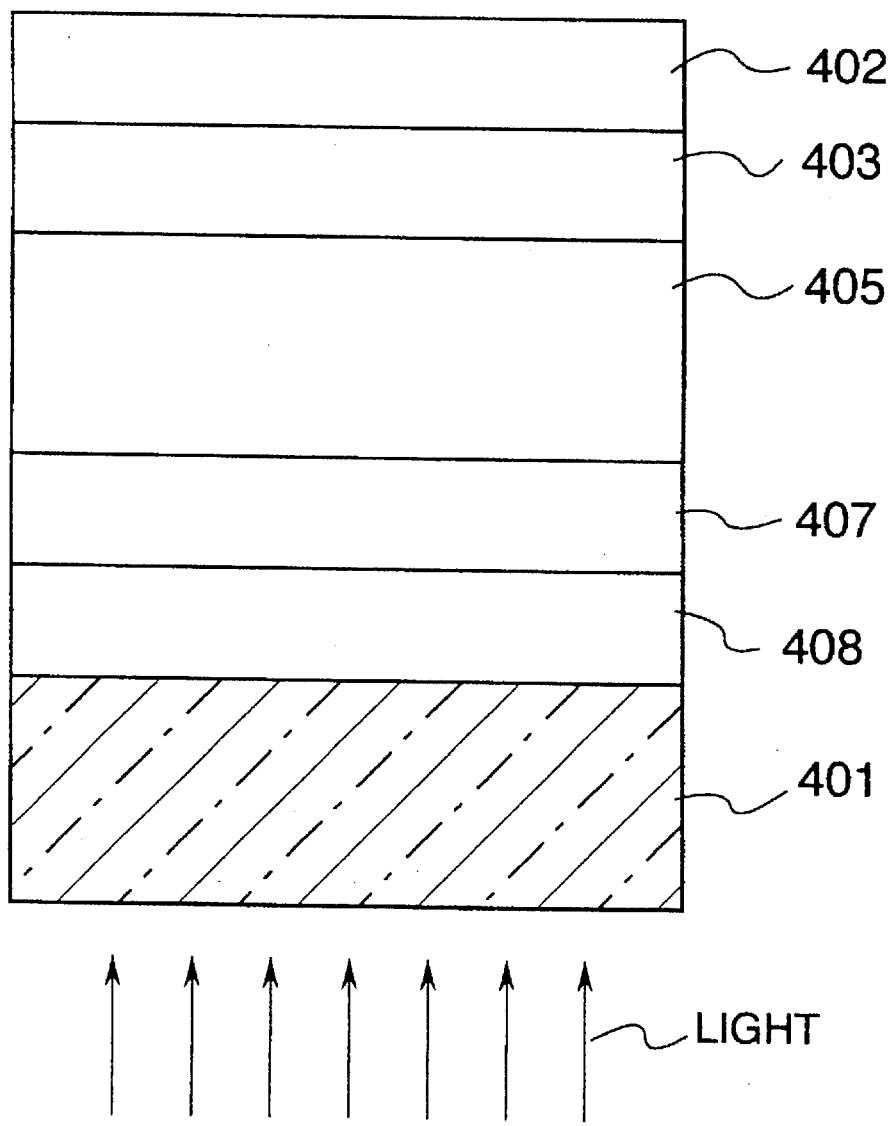
FIG. 7 is a schematic view showing the structure of another solar cell which is a photovoltaic device.

The solar cell shown in FIG. 7 comprises substrate 401 which is a light-transmission substrate, the solar cell being arranged to receive incident light from the side of the substrate 401. The solar cell shown in FIG. 7 comprises transparent electrode 408, p-type semiconductor 407, MW i-type semiconductor 405, n-type semiconductor 403, and the second electrode 402 sequentially deposited on the substrate 401.

Figure 8:
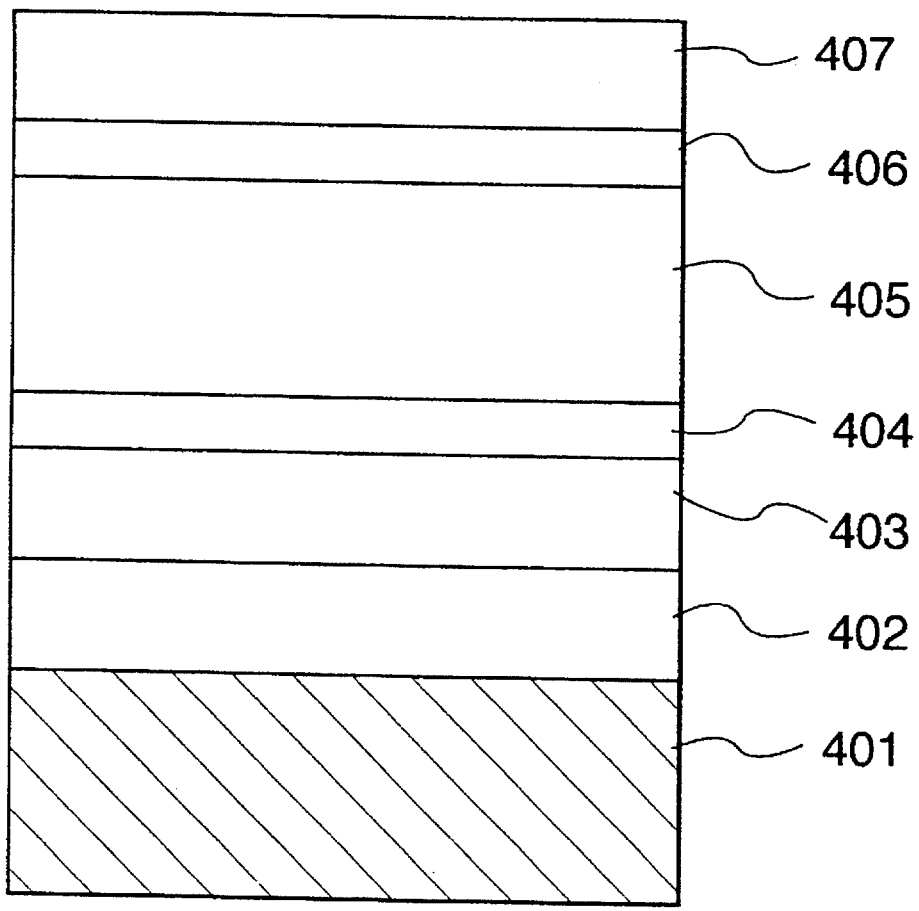
FIG. 8 is a schematic view showing the structure of yet another solar cell which is a photovoltaic device.

The solar cell shown in FIG. 8 has a structure comprising lower electrode 402, n-type semiconductor 403, RF i-type (n-side semiconductor 404, MW i-type semiconductor 405, RF i-type (p-side) semiconductor 406, and p-type semiconductor 407 sequentially formed on the substrate 401.

Figure 9:
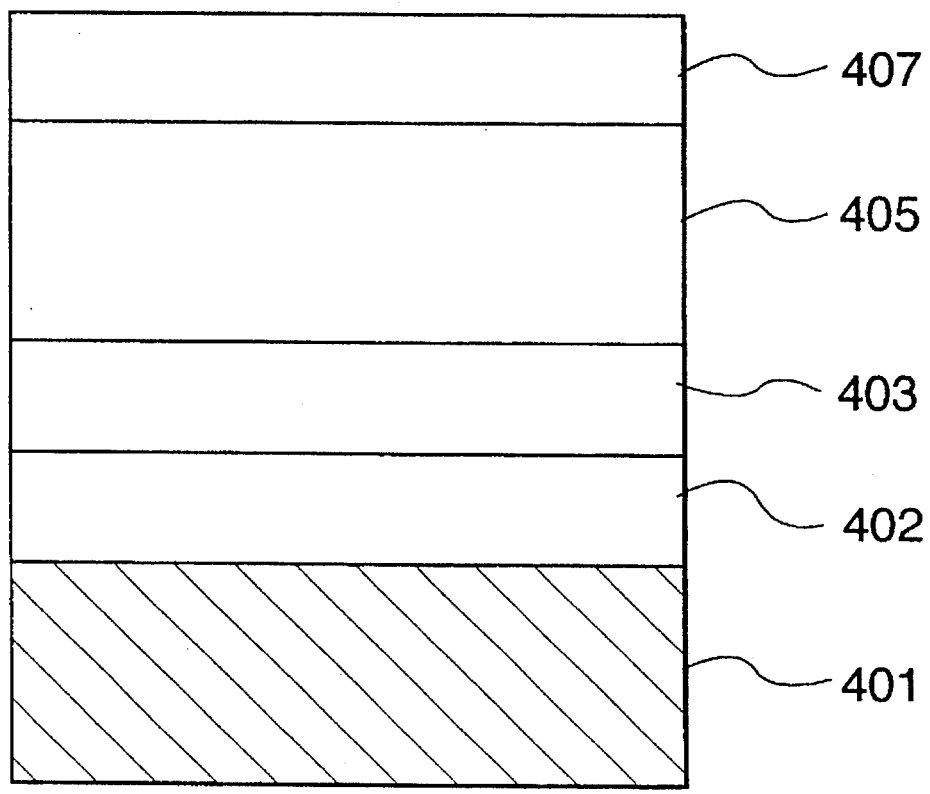
FIG. 9 is a schematic view showing the structure of still another solar cell which is a photovoltaic device.

The solar cell shown in FIG. 9 has a structure comprising lower electrode 402, n-type semiconductor 403, MW i-type semiconductor 405, p-type semiconductor 407 formed sequentially on the substrate 401.

Figure 10:
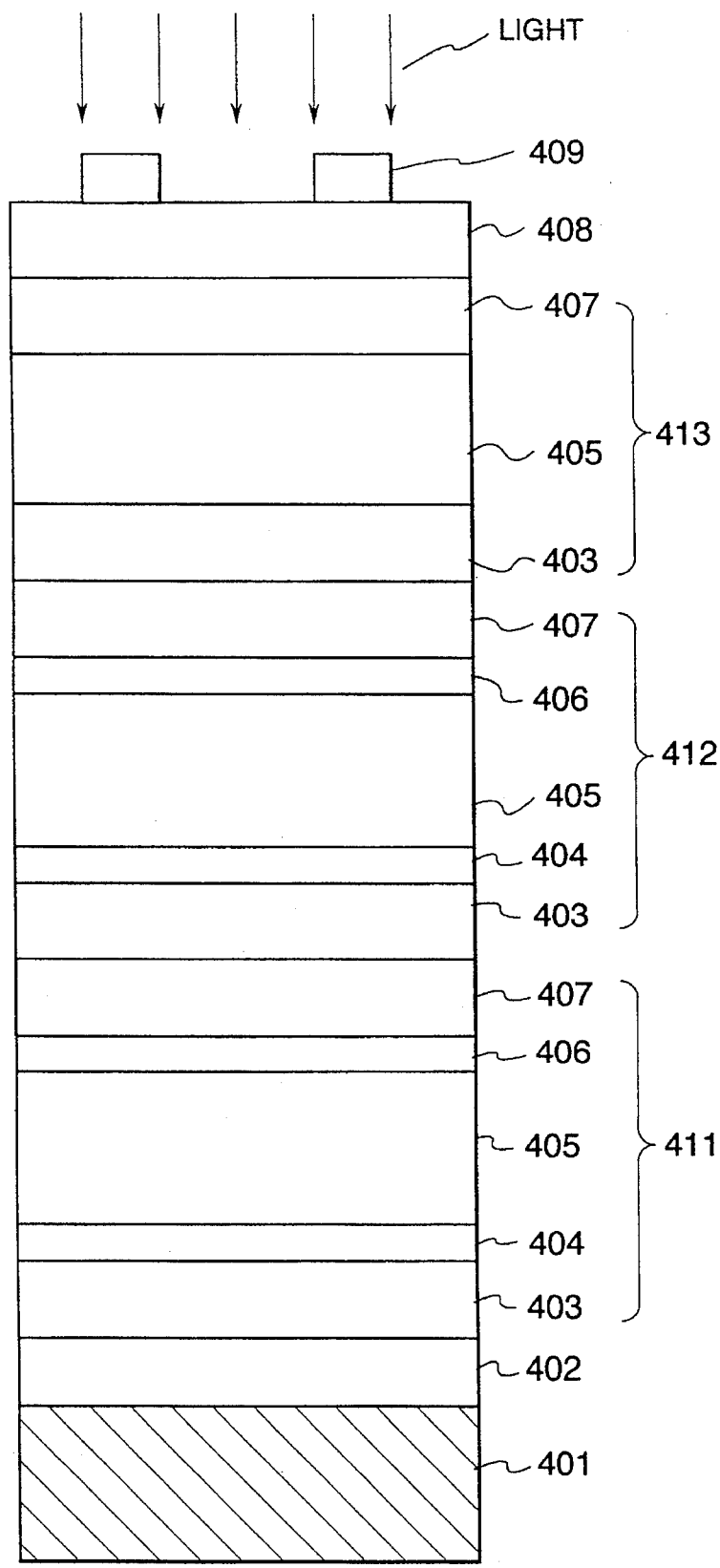
FIG. 10 is a schematic view showing the structure of a further solar cell which is a photovoltaic device.

Although each of the foregoing solar cells has only one p-i-n junction, two or more p-i-n junctions may be deposited in order to improve the efficiency of using incident light. FIG. 10 illustrates the structure of a solar cell (a so-called triple-type solar cell) having three p-i-n junctions. The foregoing solar cell comprises second electrode 402, a first semiconductor region 411 having a first p-i-n junction, a semiconductor region 412 having a second p-i-n junction, a semiconductor region 413 having a third p-i-n junction, transparent electrode 408, and collecting electrode 409 sequentially deposited on the substrate 401. Light is incident from the side of the transparent electrode 408. Also, in the foregoing solar cell the band gap and the film thickness of the i-type semiconductor 405 are made to be different in each p-i-n junction 411 to 413 in order to improve the photoelectric conversion efficiency.

The detailed structure of the foregoing solar cells will now be described. In each of the solar cells shown in FIGS. 6 to 10, the n-type semiconductor 403 and the p-type semiconductor 407 are arranged such that the p-type semiconductor 407 is positioned closer to the side of light incidence. However, a layer structure may be employed in which the n-type semiconductor 403 is positioned closer to the side of light incidence.

The substrate 401 will now be described.

It is preferable that the substrate 401 of the solar cell according to the present invention be made of a material which can be bent easily and with which a curved shape can easily be formed, the material being a conductor or insulator. Although the substrate 401 may be light-transmissive or non-light-transmissive as desired, the substrate 401 if transmissive must, of course, be light-transmissive with respect to, at least, light of wavelengths that are absorbed by the semiconductor. Specifically, the substrate 401 is exemplified by the foregoing elongated substrate 150. By using the elongated substrate 150, the weight of the solar cell to be manufactured can be reduced, the strength of the same can be improved, and the space required to transport the solar cell can be reduced.

The electrodes for outputting electric power from the solar cell will now be described.

In the solar cell according to the present invention, the electrodes are selected arbitrarily depending on the structure of the cell. The electrodes are exemplified by the second electrode 402, the transparent electrode 408 and the collecting electrode 409 (provided that the transparent electrode 408 is an electrode disposed on the light incident side and the second electrode 402 is an electrode opposed to the transparent electrode 408 through the semiconductors 403 to 407).

The foregoing electrodes will now be described in detail.

(i) Second Electrode 402

The position at which the second electrode 402 is disposed depends upon whether the material of the substrate 401 is light transmissive because the side on which light for generating the photovoltaic power is applied is different. When the substrate 401 is made of a material such as metal or the like which is a non-light-transmissive material, light is applied through the transparent electrode 408, as shown in FIG. 6.

Specifically, in a case of a layer structure shown in any of FIGS. 6, 8, 9, or 10, the second electrode 402 is disposed between the substrate 401 and the n-type semiconductor 403. If the substrate 401 is conductive, the substrate 401 is able to also serve as the second electrode 402. Therefore, a separate second electrode can be omitted from the structure. However, in a case where the substrate 401 has some conductivity but a large sheet resistance, an electrode having a small resistance for outputting electric current or a second electrode 402 for the purpose of increasing the reflectance of the surface of the support member 401 in order to more efficiently use the incident light may be provided.

In the case shown in FIG. 7, a light transmissive substrate 401 is used and light is made incident from the side of the substrate 401. Therefore, the second electrode 402 is disposed opposite the substrate 401 through the semiconductors 403 to 407 in order to output electric current and to reflect unabsorbed light.

The material of the second electrode 402 is exemplified by metals, such as Ag, Au, Pt, Ni, Cr, Cu, Al, Ti, Zn, Mo, W, or the like or their alloys. A thin film of any of the foregoing materials may be formed by vacuum evaporation, electron beam evaporation, or sputtering. The formed metal thin film must not be a resistive component with respect to the output from the solar cell. Thus, it is preferable that the sheet resistance of the second electrode 402 be 50 $\Omega$ or lower, and more preferably 10 $\Omega$ or lower.

Between the second electrode 402 and the n-type semiconductor 403 there may be provided a diffusion preventive layer (not shown), such as a thin film of zinc oxide having conductivity. The diffusion preventive layer has an effect of preventing diffusion of metal elements constituting the second electrode 402 into the n-type semiconductor 403. Further, the electrical resistance value of such a layer is able to prevent short circuits between the second electrode 402 and the transparent electrode 408 due to defects such as pinholes generated in each of the semiconductors 403 to 407. Furthermore, the thin film of zinc oxide causes multi-interference of light to occur so that incident light is trapped within the photoelectric conversion device. Furthermore, the second electrode 402 itself may be formed by a transparent conductive material such as $ZnO$, $SnO_2$, ITO or the like.

(ii) Transparent Electrode 408

It is preferable that the transparent electrode 408 has a light transmissivity of 85% or more in order to cause light energy from the sun or a white fluorescent lamp to be efficiently absorbed by the semiconductor layers 403 to 407. Furthermore, it is preferable that the sheet resistance of the transparent electrode 408 be 100 $\Omega$ or less in order to prevent the transparent electrode 408 from serving as a resistance component with respect to the output of the solar cell. A material having the foregoing characteristics is exemplified by a metal oxide, such as $SnO_2$, $IN_2O_3$, $ZnO$, $CdO$, $Cd_2SnO_4$, ITO ($In_2O_3+SnO_2$) or the like; and a thin metal film formed by considerably thinning a metal layer, such as of Au, Al, Cu or the like, into a semitransparent film. The transparent electrode 408 is formed on the p-type semiconductor 407 of the solar cell shown in FIGS. 6, 8, and 9. The transparent electrode 408 is, in the solar cell shown in FIG. 7, formed on the substrate 401. Therefore, excellent adhesion is required between the transparent electrode 408 and the corresponding surface. The transparent electrode 408 can be manufactured by electrical resistance heating evaporation, electron beam heating evaporation, sputtering (direct sputtering or indirect sputtering), spraying, and the like.

(iii) Collecting Electrode 409

The collecting electrode 409 is, in the form of a lattice, formed on the transparent electrode 408 for the purpose of effectively reducing the resistance of the transparent electrode 408. The collecting electrode 409 may be made of a metallic material such as Ag, Cr, Ni, Al, Au, Ti, Pt, Cu, Mo, W or the like or their alloys, or a conductive paste containing the foregoing metals or metal alloys; and a carbon paste. The foregoing metals, alloys, or pastes may be laminated, if necessary. The shape and the area of the collecting electrode 409 are designed to maintain a sufficiently large quantity of light made incident on each of the semiconductors 403 to 407.

It is preferable that the shape of the collecting electrode 409 be such that it is uniformly widened with respect to the light receiving surface of the solar cell and as well as the area of the same with respect to the light receiving area be 15% or less, and more preferably 10% or less. It is preferable that the sheet resistance be 50 $\Omega$ or less, and more preferably 10 $\Omega$ or less.

(iv) n-type Semiconductor 403, i-type Semiconductors 404–406, and p-type Semiconductor 407

The n-type semiconductor 403, the i-type semiconductors 404–406, and the p-type semiconductor 407 will be explained below.

The material of the semiconductor for use in the present invention is selected from a group consisting of a group IV element such as Si, C, Ge, or the like, or an alloy containing group IV elements, such as SiGe, SiC, SiSn, or the like.

Among the materials for the semiconductor, any of the following alloy type non-single crystalline semiconductor materials can be preferably employed to manufacture the photovoltaic device according to the present invention: a-Si:H (hydrogenated amorphous silicon), a-Si:F, a-Si:H:F, a-SiGe:H, a-SiGe:F, a-SiGe:H:F, a-SiC:H, a-SiC:F, a-SiC:H:F or the like.

The semiconductor layer may be subjected to valence electron control and forbidden band width control. Specifically, a raw material compound containing an element serving as a valence electron controlling material or a forbidden band width control material is supplied, either solely or in the form of a mixture with the raw material gas for forming the deposited film or a dilution gas before it is introduced into the space for film formation.

The semiconductor layer is, in at least a portion thereof, doped to form p-type and n-type regions due to the valence electron control so that at least one p-i-n junction is formed. By depositing a plurality of p-i-n junctions, a so-called stacked cell structure is formed.

The semiconductor layer can be formed by various CVD methods such as microwave plasma CVD, RF plasma CVD, photo CVD, thermal CVD or MOCVD; various evaporating methods, such as EB evaporation, MBE, ion plating or ion beam; sputtering; spraying; or printing. From the industrial viewpoint, plasma CVD including the steps of decomposing a raw material gas and depositing films on the substrate is preferably employed.

The semiconductors using group IV or group IV type alloy amorphous semiconductor material for use in manufacture of the photovoltaic device according the present invention will now be described.

(a) i-Type Semiconductors 404 to 406

In the photovoltaic device using the amorphous semiconductor, which is a group IV or group IV type alloy non-monocrystal material, the i-type layer for use in forming the p-i-n junction is an important layer for generating and transporting carriers in response to the irradiation of light.

As the i-type layer, a layer having slightly p-type or n-type conductivity may be employed.

The alloy type amorphous semiconductor material contains hydrogen atoms (H, D) or halogen atoms (X) as described above that serve important functions.

Hydrogen atoms (H, D) or halogen atoms (X) contained in the i-type layer compensate dangling bonds of the i-type layer so as to improve the product of the mobility of the carriers in the i-type layer and their lifetime. Furthermore, the foregoing atoms compensate the interfacial levels in the interface between the p-type layer and the i-type layer and between the n-type layer and the i-type layer so that the photovoltaic power, electric flow, and photo response of the photovoltaic device are improved. An optimum quantity of hydrogen atoms and/or halogen atoms contained in the i-type layer is 1 to 40 atomic %. In particular, hydrogen atoms and/or halogen atoms are preferably distributed in a large quantity at the interface between the p-type layer and the i-type layer and between the n-type layer and i-type layer. A preferred content of hydrogen atoms and/or halogen atoms in the vicinity of the interfaces is in a range of 1.1 to 2 times the content of these atoms in the bulk. It is preferable that the content of hydrogen atoms and/or halogen atoms be changed correspondingly to the content of silicon atoms.

A preferred semiconductor material constituting the i-type semiconductor layer forming the first p-i-n junction in the photovoltaic device according to the present invention is amorphous silicon, while a preferred semiconductor material constituting the i-type semiconductor layers forming the second and third p-i-n junctions is amorphous silicon-germanium.

The amorphous silicon and the amorphous silicon-germanium are denoted depending upon the element(s) that compensates the dangling bonds as: a-Si:H, a-Si:F, a-Si:H:F, a-SiGe:H, a-SiGe:F, and a-SiGe:H:F.

More specifically, the material of the i-type semiconductor layers forming the first p-i-n junction 413 suitable for use in the photovoltaic device according to the present invention (see FIG. 10) is exemplified by i-type hydrogenated amorphous silicon (a-Si:H) preferably having characteristics such that the optical band gap (Eg), is 1.60 eV to 1.85 eV; the content of hydrogen atoms (CH) is 1.0 to 25.0%; photoconductivity ($\sigma p$) under pseudo sun light (AM 1.5) of 100 mW/cm$^2$ is $1.0 \times 10^{-5}$ S/cm or more, dark conductivity ($\sigma d$) is $1.0 \times 10^{-9}$ S/cm or less; inclination of the Urbach tail by measuring via a Contact Photocurrent Method (CPM) is 55 meV or less; and the localized state density is $10^{17}$/cm$^3$ or less.

Amorphous silicon-germanium, which is a non-monocrystalline material for forming the i-type semiconductor layers and having the second and the third p-i-n junctions 412 and 411 for use in the photovoltaic device according to the present invention, has characteristics such that the optical band gap (Eg) is 1.20 eV to 1.60 eV; and the content (CH) of hydrogen atoms is 1.0% to 25.0%. To effectively utilize the rapid temperature change of the invention, the optimum deposition speed is 0.2 nm/second to 20 nm/second. To realize the foregoing deposition speed and as well as to manufacture the amorphous silicon-germanium having the foregoing characteristics, it is preferable that the flow rate of the raw material gas into the discharge space is 200 sccm or more. It is preferable that the flow rate ratio of the gas containing germanium atoms is 40% or less.

A preferred temperature for forming a deposited film is 100° C. to 450° C.

(b) p-type Semiconductor Layer 407 and n-Type Semiconductor Layer 403

The amorphous material (referred to as "a-") of the p-type layer and the n-type layer (a microcrystalline material, referred to as "μc-", is also included in the category of amorphous material) is exemplified by a material prepared by adding a p-type valence electron controlling material (B, Al, Ga, In, or Tl in group III of the periodic table) or an n-type valence electron controlling material (P, As, Sb or Bi in group V of the periodic table) at a high concentration to materials such as a-Si:H, a-Si:HX, a-SiC:H, a-SiC:HX, a-SiGe:H, a-SiGeC:H, a-SiO:H, a-SiN:H, a-SiON:HX, a-SiOCN:HX, μc-Si:H, μc-SiC:H, μc-Si:HX, μc-SiC:HX, μc-SiGe:H, μc-SiO:H, μc-SiGeC:H, μc-SiN:H, μc-SiON:H, μc-SiOCN:HX or the like. The polycrystalline material (referred to as "poly-") is exemplified by a material prepared by adding a p-type valence electron controlling material (B, Al, Ga, In, or Tl in group III of the periodic table) or an n-type valence electron controlling material (P, As, Sb, or Bi in group V of the periodic table) at a high concentration to materials such as poly-Si:H, poly-Si:HX, poly-SiC:H, poly-SiC:HX, poly-SiGe:H, poly-Si, poly-SiC, poly-SiGe or the like.

It is preferable that the p-type layer or the n-type layer on the light incident side be a semiconductor layer which is a crystalline semiconductor layer which absorbs a small quantity of light or a semiconductor layer which has a wide band gap, more particularly an amorphous semiconductor.

The optimum quantities of the group III element of the periodic table in the p-type layer and the group V of the periodic table in the n-type layer are 0.1 atomic % to 50 atomic %.

Hydrogen atoms (H, D) or halogen atoms contained in the p-type layer or the n-type layer compensate dangling bands of the p-type layer or the n-type layer so as to improve the doping efficiency of the p-type layer and the n-type layer. A preferred quantity of hydrogen atoms or halogen atoms to be added to the p-type layer or the n-type layer is 0.1 atomic % to 40 atomic %. In a case where the p-type layer or the n-type layer is a crystalline layer, an optimum quantity of hydrogen atoms or halogen atoms is 0.1 atomic % to 8 atomic %. In particular, hydrogen atoms and/or halogen atoms are preferably distributed in a large quantity in the interface between the p-type layer and the i-type layer and between the n-type layer and the i-type layer. A preferred content of hydrogen atoms and/or halogen atoms in the vicinity of the interfaces is a in a range of 1.1 to 2 times the content of these atoms in the bulk. By causing hydrogen atoms and/or halogen atoms to be contained in a large quantity in the vicinity of the interface between the p-type layer and the i-type layer and between the n-type layer and the i-type layer, defect levels and mechanical distortions in the vicinity of the interfaces can be reduced. Thus, the photovoltaic power and current of the photovoltaic device according to the present invention can be increased.

It is preferable that the electrical characteristics of the p-type layer and the n-type layer of the photovoltaic device be such that the activation energy is 0.2 eV or less, and most preferably 0.1 eV or less. The resistance is preferably 100 Ω cm or less, and most preferably 1 Ω cm or less. It is preferable that the thickness of each of the p-type layer and the n-type layer be 1 nm to 50 nm, and most preferably 3 nm to 10 nm.

To form the group IV and group IV alloy type amorphous semiconductor layers serving as the preferred semiconductor layers of the photovoltaic device according to the present invention, the optimum manufacturing method is a microwave plasma CVD method. Also, an RF plasma CVD method may be employed as a second preferable manufacturing method.

The microwave plasma CVD method is a method comprising the steps of: introducing gases such as the raw material gases and dilution gas into a deposition chamber (a vacuum chamber); making the internal pressure of the deposition chamber constant while exhausting by using a vacuum pump; and introducing microwaves generated by a microwave power source through a wave introducing pipe into the deposition chamber through a dielectric window (an alumina ceramic window or the like) to generate plasma of the raw material gas to decompose the raw material so that a desired deposited film is formed on a substrate placed in the deposition chamber. The foregoing method enables a deposited film suitable for the photovoltaic device to be formed under a wide range of deposition conditions.

The raw material gas suitable to deposit the group IV and group IV alloy type amorphous semiconductor layer preferably employed to manufacture the photovoltaic device according to the present invention is, for example, a compound which contains silicon atoms and can be gasified; a compound which contains germanium atoms and can be gasified; a compound which contains carbon atoms and can be gasified; a compound which contains nitrogen atoms and can be gasified; a compound which contains oxygen atoms and can be gasified; and their gas mixtures.

Specifically, the compound which contains silicon atoms and can be gasified is a chain or cyclic silane compound exemplified by the following gaseous materials or materials that can easily be gasified: $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, $Si_2D_3H_3$, $(SiF_2)_5$, $(SiF_2)_6$, $(SiF_2)_4$, $SiF_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$, and $Si_2Cl_3F_3$.

The compound which contains germanium atoms and can be gasified is exemplified by $GeH_4$, $GeD_4$, $GeFH_3$, $GeF_2H_2$, $GeF_3H$, $GeHD_3$, $GeH_2D_2$, $GeH_6$, and $Ge_2D_6$.

The compound which contains carbon atoms and can be gasified is exemplified by $CH_4$, $CD_4$, $C_nH_{2n+2}$ (n is an integer), $C_nH_{2n}$ (n is an integer), $C_2H_2$, $C_6H_6$, $Co_2$, and CO.

The gas containing nitrogen is exemplified by $N_2$, $NH_3$, $ND_3$, NO, $NO_2$, and $N_2O$.

The gas containing oxygen is exemplified by $O_2$, CO, $CO_2$, NO, $NO_2$, $CH_3CH_2OH$, and $CH_3OH$.

The material to be introduced into the p-type layer or the n-type layer to control valence electrons is exemplified by atoms in group III or group V of the periodic table.

An effective starting material for the introduction of atoms of group III is exemplified as follows: the material for introducing boron atoms is exemplified by a boron hydride such as $B_2H_6$, $B_4H_{10}$, $B_5H_9$, $B_5H_{11}$, $B_6H_{10}$, $B_6H_{12}$, and $B_6H_{14}$; and a boron halide such as $BF_3$ and BCl. Furthermore, $AlCl_3$, $GaCl_3$, $InCl_3$, and $TlCl_3$ are also useful. In particular, it is preferable to employ $B_2H_6$ or $BF_3$.

An effective starting material for the introduction of atoms in group V is exemplified as follows: the material for introducing phosphorous is exemplified by a phosphorous hydride such as $PH_3$ and $P_2H_4$; and a phosphorous halide such as $PH_4I$, $PF_3$, $PF_5$, $PCl_3$, $PCl_5$, $PBr_3$, $PBr_5$, and $PI_3$. Furthermore, other materials are useful: $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$. In particular, it is preferable to employ $PH_3$ or $PF_3$.

The foregoing compounds, which can be gasified, may be arbitrarily diluted with $H_2$, He, Ne, Ar, Xe, or Kr gas before it is introduced into the deposition chamber.

In the case where the layer of a microcrystal semiconductor or a-SiC:H that does not absorb light in a large quantity or has a wide band gap is deposited, it is preferable that a method be employed with comprises the steps of diluting the raw material gas 2 to 100 times with a hydrogen gas, and introducing microwave energy or relatively large energy RF power. As an alternative to this, the layer may be formed at a relatively high temperature.

In the case where a photovoltaic apparatus having a desired output voltage and electric current by using the photovoltaic devices according to the present invention is required, the photovoltaic devices according to the present invention are connected in series or in parallel, a protective layer is formed on each of the two sides of the photovoltaic device, and output electrodes and the like are provided. In the case where the photovoltaic devices according to the present invention are connected in series, a reverse-flow-preventive diode is sometimes included.

EXAMPLE 1

A photovoltaic device was manufactured by using the deposited film forming apparatus 100 shown in FIG. 1 and according to the following procedure.

Initially, an elongated (belt-like) substrate 150 (having a width of 40 cm, length of 200 m, and a thickness of 0.125 mm) made of stainless steel (SUS430BA) was sufficiently degreased, cleaned, and placed in a continuous sputtering apparatus (not shown). Then, a silver electrode (purity: 99.99%) was used as a target and a silver thin film having a thickness of 100 nm was deposited thereon by sputtering. Then, a ZnO electrode (purity: 99.999%) was used as a target and a ZnO thin film having a thickness of 1.2 μm was deposited on the silver thin film by sputtering. Thus, a lower electrode was formed on the elongated substrate 150.

Then, a bobbin, around which the elongated substrate 150 was wound, was installed in substrate feeding chamber 102, and the elongated substrate 150 was allowed to pass through the gas gates 151 to 156, n-type layer forming vacuum chamber 103, the microwave plasma CVD (hereinafter microwave plasma CVD is referred to as "MW") i-type layer forming vacuum chamber 101, high frequency plasma CVD (hereinafter high frequency plasma CVD is referred to as "RF") i-type layer forming vacuum chambers 104 and 105, and p-type layer forming vacuum chamber 106 to reach the substrate winding chamber 107. Then, the tension was adjusted to eliminate slack in the elongated substrate 150. Then, the substrate feeding chamber 102, n-type layer forming vacuum chamber 103, MW i-type layer forming vacuum chamber 101, RF i-type layer forming vacuum chambers 104 and 105, p-type layer forming vacuum chamber 106, and the substrate winding chamber 107 were exhausted to a level of $5\times10^{-6}$ Torr or lower by a vacuum exhausting system (not shown) comprising an oil diffusion pump, a mechanical booster pump, and a rotary pump.

While operating the vacuum exhausting system, the raw material gas for the deposited film was, under conditions shown in Table 1, introduced into the discharge chamber 113 through the gas introduction pipes 108; the raw material gas for the deposited film was, under conditions shown in Table 2, introduced into the discharge chamber 114 through the gas introduction pipe 109; the raw material gas for the deposited film was, under conditions shown in Table 3, introduced into the discharge chamber 115 through the gas introduction pipe 110; the raw material gas for the deposited film was, under conditions shown in Table 4, introduced into the discharge chamber 116 through the gas introduction pipe 111; and the raw material gas for the deposited film was, under conditions shown in Table 5, introduced into the discharge chamber 117 through the gas introduction pipe 112. Simultaneously, hydrogen gas as gate gas was supplied to gas gates 151, 152, 153, 154, 155, and 156 through the corresponding gas gate supply pipes (not shown) at a flow rate of 500 sccm. In the thus-realized state, the exhaust conditions of the vacuum exhausting system were adjusted to maintain the internal pressure of the discharge chamber 113 at 5 mTorr and that of each of the discharge chambers 114, 115, 116, and 117 at 1.2 Torr.

After the pressure in each of the discharge chambers 113, 114, 115, 116, and 117 had been stabilized, the movement of the elongated substrate 150 from the substrate feeding chamber 102 to the substrate winding chamber 107 was started at a substrate moving speed of 100 cm/minute. While moving the elongated substrate 150, the infrared-ray lamp heaters 118, 119, 120, 121, 122, 123, and 124 were turned on. Then, the elongated substrate 150 was heated by the heater 120 immediately before entering the inlet of the discharge chamber 113. Cold water was allowed to flow to the cooling rollers 125 so that the elongated substrate 150 was cooled immediately after passing the discharge chamber 113.

By adjusting the lamp heaters and the flow rate of the cooling water, the temperature gradients between the thermocouples 126 and 127 and between the thermocouples 128 and 129 were made to be 1 degree/second to 50 degrees/second. The moving speed of the elongated substrate 150 and the length of the discharge chamber were adjusted to make the thickness of the deposited film to be the same, and then the conditions were changed within the range shown in Table 8 so as to make the deposition speed 5 nm/second, and the temperature of the substrate for the MW i-type layer was set to be higher than that of the RF i-type layer by 50° C.

At this time, the thermocouples 126, 127, 128, and 129 disposed in the vacuum chamber 101 in contact with the reverse side of the moving elongated substrate 150 measured the temperatures of the substrate 150 at predetermined positions in the direction in which the substrate 150 was moved. Thus, the moving speed of the elongated substrate 150 was used to obtain the change rate of the substrate temperature per unit time immediately before and immediately after the discharge chamber 113.

Then, the discharge electrodes in the discharge chambers 114, 115, 116, and 117 were supplied with high frequency electric power having a frequency of 13.56 MHz from the respective high frequency power source so that glow discharge was caused to take place in the discharge chambers 114, 115, 116, and 117. Microwave electric power having a frequency of 2.45 GHz, was supplied to each window 130 in the discharge chamber 113 through the wave guide pipe 131 from the microwave power source 132 to cause microwave glow discharge to take place in the discharge chamber 113. Thus, semiconductors 403–407 having p-i-n junction as shown in FIG. 8 were formed on the elongated substrate 150 for 10 minutes by sequentially depositing an n-type semiconductor in the n-type layer forming vacuum chamber 103, i-type semiconductors in the i-type layer forming vacuum chambers 104, 101, and 105, and a p-type semiconductor in the p-type layer forming vacuum chamber 106.

After the semiconductors 403 to 407 had been formed on the elongated substrate 150, the elongated substrate 150 was cooled and then it was taken out from the continuous deposited film forming apparatus. A secondary ion mass analyzer (SIMS) (IMS-4F manufactured by CAMECA) was used to examine the distribution of impurities in the i-type semiconductor layer in the deposited film.

The results of the examination are shown in Table 6.

As can be understood from the results, by heating and cooling performed at a rate of temperature change of 4° C./second or higher before and after forming the i-type semiconductor layer, the diffusion of impurities into the i-type semiconductor layer can be prevented.

EXAMPLE 2

Figure 2:
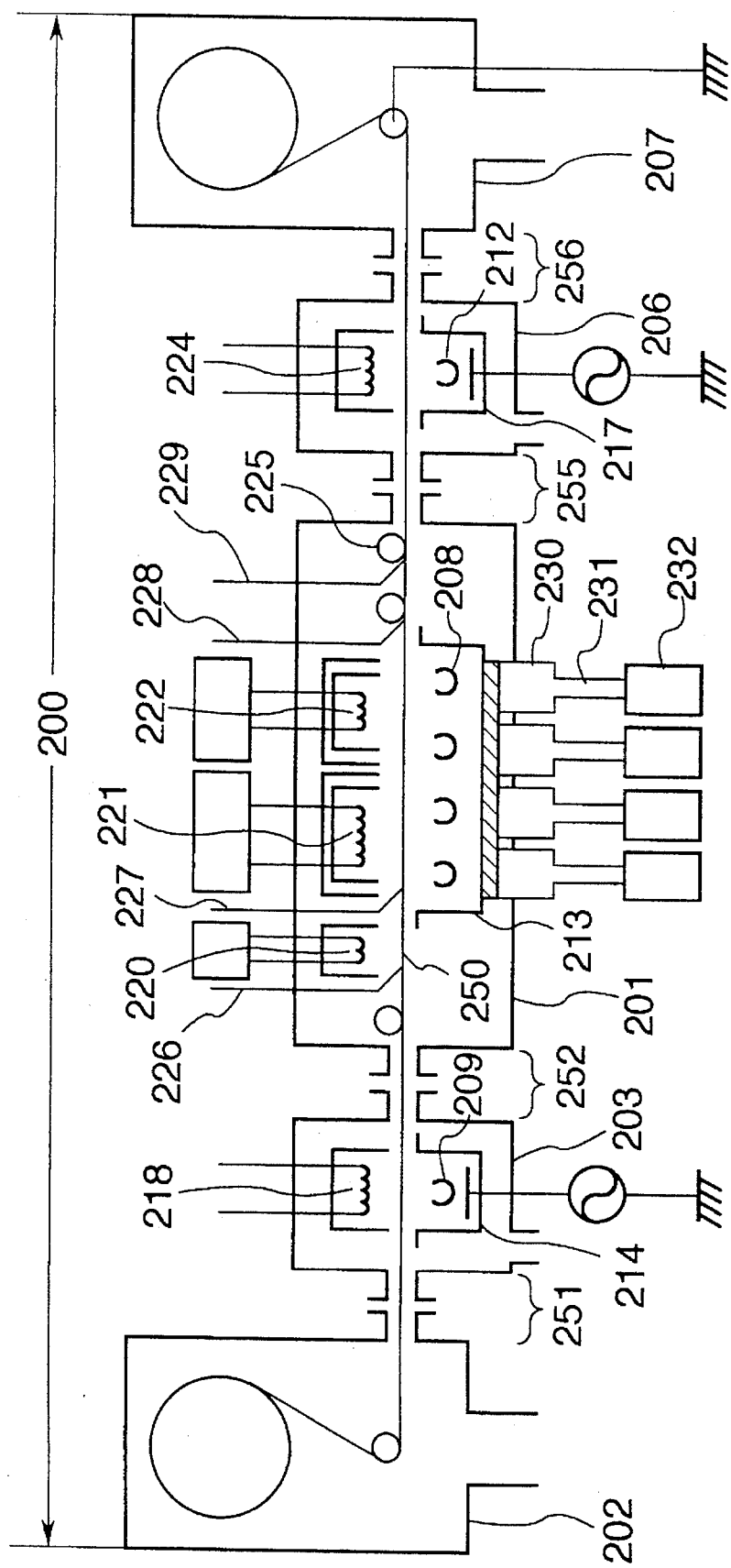
FIG. 2 is a schematic view which illustrates an apparatus for forming a deposited film according to another embodiment of the present invention.

Similarly to Example 1, a photovoltaic device was manufactured by using the deposited film forming apparatus 200 shown in FIG. 2 according to the following procedure.

Initially, similarly to Example 1, an elongated substrate 250 (having a width of 40 cm, length of 200 m, and a thickness of 0.125 mm) made of stainless steel (SUS430BA) was sufficiently degreased, cleaned, and placed in a continuous sputtering apparatus (not shown). Then, a silver electrode (purity: 99.99%) was used as a target and a silver thin film having a thickness of 100 nm was deposited thereon by sputtering. Then, a ZnO electrode (purity: 99.999%) was used as a target and a ZnO thin film having a thickness of 1.2 µm was deposited on the silver thin film by sputtering. Thus, a lower electrode was formed on the elongated substrate 250.

Then, a bobbin, around which the elongated substrate 250 was wound, was installed in substrate feeding chamber 202, and the elongated substrate 250 was allowed to pass through the gas gates 251 to 256, n-type layer forming vacuum chamber 203, the MW i-type layer forming vacuum chamber 201, and the p-type layer forming vacuum chamber 206 to reach the substrate winding chamber 207. Then, the tension was adjusted to eliminate slack in the elongated substrate 250. Then, the substrate feeding chamber 202, n-type layer forming vacuum chamber 203, MW i-type layer forming vacuum chamber 201, p-type layer forming vacuum chamber 206, and the substrate winding chamber 207 were exhausted to a level of $5 \times 10^{-6}$ Torr or lower by a vacuum exhausting system (not shown) comprising an oil diffusion pump, a mechanical booster pump, and a rotary pump.

While operating the vacuum exhausting system, the raw material gas for the deposited film was, under conditions similar to those shown in Table 1, introduced into the discharge chamber 213 through the gas introduction pipes 208; the raw material gas for the deposited film was, under conditions shown in Table 2, introduced into the discharge chamber 214 through the gas introduction pipe 209; and the raw material gas for the deposited film was, under conditions shown in Table 5, introduced into the discharge chamber 217 through the gas introduction pipe 212. Simultaneously, hydrogen gas, as gate gas, was supplied to gas gates 251, 252, 255, and 256 through the corresponding gas gate supply pipes (not shown) at a flow rate of 500 sccm. In the thus-realized state, the exhaust conditions of the vacuum exhausting system were adjusted to maintain the internal pressure of the discharge chamber 213 at 5 mTorr and that of each of the discharge chambers 214 and 217 at 1.2 Torr.

After the pressure in each of the discharge chambers 213, 214, and 217 had been stabilized, the movement of the elongated substrate 250 from the substrate feeding chamber 202 to the substrate winding chamber 207 was started at a substrate moving speed of 100 cm/minute. While moving the elongated substrate 250, the infrared-ray lamp heater 220 was turned on to heat the elongated substrate 250 immediately before the inlet of the discharge chamber 213. Cold water was allowed to flow to the cooling rollers 225 so that the elongated substrate 250 was cooled immediately after passing through the discharge chamber 213.

By adjusting the lamp heater and the flow rate of cooling water similarly to Example 1, the temperature gradients between the thermocouples 226 and 227 and between the thermocouples 228 and 229 were made to be 1 degree/second to 50 degrees/second. The moving speed of the elongated substrate 250 and the length of the discharge chamber were adjusted to make the thickness of the deposited film to be the same, and then the conditions were changed within the range shown in Table 8 so as to make the deposition speed 5 nm/second, and the temperature of the substrate for the MW i-type layer was set to be higher than that of each of the n-type layer and the p-type layer by 50° C. Thus, the moving speed of the elongated substrate 250 was used to obtain the change rate of the substrate temperature per unit time immediately before and immediately after the discharge chamber 213.

Then, the discharge electrodes in the discharge chambers 214 and 217 were supplied with high frequency electric power having a frequency of 13.56 MHz from high frequency power sources so that glow discharge was caused to take place in the discharge chambers 214 and 217. Microwave electric power having a frequency of 2.45 GHz was supplied to each window 230 in the discharge chamber 213 through the wave guide pipe 231 from the microwave power source 232 to cause microwave glow discharge to take place in the discharge chamber 213. Thus, semiconductors 403 to 407 having pin junction shown in FIG. 9 were formed on the elongated substrate 250 for 10 minutes by sequentially forming an n-type semiconductor in the n-type layer forming vacuum chamber 203, an i-type semiconductor in the MW i-type layer forming vacuum chamber 201, and a p-type semiconductor in the p-type layer forming vacuum chamber 206.

After the semiconductors 403 to 407 had been formed on the elongated substrate 250, the elongated substrate 250 was cooled and then it was taken out from the continuous deposited film forming apparatus. A secondary ion mass analyzer (SIMS) (IMS-4F manufactured by CAMECA) was used to examine the distribution of impurities in the i-type semiconductor layer in the deposited film.

The results of the examination are shown in Table 7.

As can be understood from the results, by heating and cooling performed at a rate of temperature change of 4° C./second or higher before and after forming the i-type semiconductor layer, the diffusion of impurities into the i-type semiconductor layer can be prevented.

EXAMPLE 3

Similarly to Example 1, a photovoltaic device was manufactured by using the deposited film forming apparatus 100 shown in FIG. 1 according to the following procedure.

Initially, an elongated substrate 250 (having a width of 40 cm, length of 200 m, and a thickness of 0.125 mm) made of stainless steel (SUS430BA) was sufficiently degreased, cleaned, and placed in a continuous sputtering apparatus (not shown). Then, a silver electrode (purity: 99.99%) was used as a target and a silver thin film having a thickness of 100 nm was deposited thereon by sputtering. Then, a ZnO electrode (purity: 99.999%) was used as a target and a ZnO thin film having a thickness of 1.2 μm was deposited on the silver thin film by sputtering. Thus, a lower electrode was formed on the elongated substrate 150.

Then, a bobbin, around which the elongated substrate 150 was wound, was installed in substrate feeding chamber 102, and the elongated substrate 150 was allowed to pass through the gas gates 151 to 156, n-type layer forming vacuum chamber 103, the MW i-type layer forming vacuum chamber 101, RF i-type layer forming vacuum chambers 104 and 105, and p-type layer forming vacuum chamber 106 to reach the substrate winding chamber 107. Then, the tension was adjusted to eliminate slack in the elongated substrate 150. Then, the substrate feeding chamber 102, n-type layer forming vacuum chamber 103, MW i-type layer forming vacuum chamber 101, RF i-type layer forming vacuum chambers 104 and 105, p-type layer forming vacuum chamber 106, and the substrate winding chamber 107 were exhausted to a level of $5 \times 10^{-6}$ Torr or lower by a vacuum exhausting system (not shown) comprising an oil diffusion pump, a mechanical booster pump, and a rotary pump.

While operating the vacuum exhausting system, the raw material gas for the deposited film was, under conditions shown in Table 8, introduced into the discharge chamber 113 through the gas introduction pipes 108; the raw material gas for the deposited film was, under conditions shown in Table 2, introduced into the discharge chamber 114 through the gas introduction pipe 109; the raw material gas for the deposited film was, under conditions shown in Table 3, introduced into the discharge chamber 115 through the gas introduction pipe 110; the raw material gas for the deposited film was, under conditions shown in Table 4, introduced into the discharge chamber 116 through the gas introduction pipe 111; the raw material gas for the deposited film was, under conditions shown in Table 5, introduced into the discharge chamber 117 through the gas introduction pipe 112. Simultaneously, hydrogen gas as gate gas was supplied to gas gates 151, 152, 153, 154, 155, and 156 through the corresponding gas gate supply pipes (not shown) at a flow rate of 500 sccm. In the thus-realized state, the exhaust conditions of the vacuum exhausting system were adjusted to maintain the internal pressure of the discharge chamber 113 at 5 mTorr and that of each of the discharge chambers 114, 115, 116, and 117 at 1.2 Torr.

After the pressure in each of the discharge chambers 113, 114, 115, and 116 had been stabilized, the movement of the elongated substrate 150 from the substrate feeding chamber 102 to the substrate winding chamber 107 was started at the substrate moving speed of 100 cm/minute. While moving the elongated substrate 150, the infrared-ray lamp heaters 118, 119, 120, 121, 122, 123, and 124 were turned on. Then, the elongated substrate 150 was heated by heater 120 immediately before entering the inlet of the discharge chamber 113. Cold water was allowed to flow to the cooling rollers 125 so that the elongated substrate 150 was cooled immediately after passing the discharge chamber 113.

By setting the substrate temperature during formation of the MW i-type layer to be higher than that of the RF i-type layer by 50° C. and by adjusting the lamp heaters and the flow rate of cooling water, the temperature gradients between the thermocouples 126 and 127 and between the thermocouples 128 and 129 were made to be 10 degrees/second. Then, the deposition speed was changed to 0.5 nm/second to 25 nm/second within the range shown in Table 8. Furthermore, the moving speed of the elongated substrate 150 and the length of the discharging chamber were adjusted to make the thickness of the deposited film to be the same.

Then, the discharge electrodes in the discharge chambers 114, 115, 116, and 117 were supplied with high frequency electric power having a frequency of 13.56 MHz from high frequency power sources so that glow discharge was caused to take place in the discharge chambers 114, 115, 116, and 117. Microwave electric power having a frequency of 2.45 GHz, was supplied to each window 130 in the discharge chamber 113 through the wave guide pipe 131 from the microwave power source 132 to cause microwave glow discharge to take place in the discharge chamber 113. Thus, semiconductors 403–407 forming a p-i-n junction as shown in FIG. 6 were formed on the elongated substrate 150 for 10 minutes by sequentially forming an n-type semiconductor in the n-type layer forming vacuum chamber 103, i-type semiconductors in the i-type layer forming vacuum chambers 104, 101, and 105, and a p-type semiconductor in the p-type layer forming vacuum chamber 106.

After the semiconductors 403 to 407 had been formed on the elongated substrate 150, the elongated substrate 150 was cooled and then taken out from the continuous deposited film forming apparatus. Furthermore, the transparent electrode 408 and the collecting electrode 409 were formed on the p-type semiconductor 407 to complete formation of an elongated photoelectric conversion device.

Then, a continuous module forming apparatus (not shown) was used to form the manufactured solar cells into a plurality of solar cell modules each having a size 36 cm×22 cm. By using pseudo sun light of AM 1.5 and 100 mW/cm$^2$, the characteristics were evaluated to examine the relationship between the deposition speed of the i-type semiconductor layer 405 and the characteristics.

The results are shown in Table 9.

As can be understood from the results, by heating and cooling performed at a rate of temperature change of 4° C./second or higher before and after forming the i-type semiconductor layer and raising the deposition speed to shorten the heating time, the diffusion of impurities into the i-type semiconductor layer causing deterioration of the characteristics of the solar cell can be prevented. It can be understood that deterioration of the characteristics of the solar cell due to the deterioration of the quality of the i-type semiconductor film can be prevented by not raising the deposition speed excessively.

EXAMPLE 4

Similarly to Example 2, a photovoltaic device was manufactured by using the deposited film forming apparatus 200 shown in FIG. 2 and in the following procedure.

Initially, similarly to Example 1, an elongated substrate 250 (having a width of 40 cm, length of 200 m, and a thickness of 0.125 mm) made of stainless steel (SUS430BA) was sufficiently degreased, cleaned, and placed in a continuous sputtering apparatus (not shown). Then, a silver electrode (purity: 99.99%) was used as a target and a silver thin film having a thickness of 100 nm was deposited thereon by sputtering. Then, a ZnO electrode (purity: 99.999%) was used as a target and a ZnO thin film having a thickness of 1.2 μm was deposited on the silver thin film by sputtering. Thus, a lower electrode was formed on the elongated substrate 250.

Then, a bobbin, around which the elongated substrate 250 was wound, was installed in substrate feeding chamber 202, and the elongated substrate 250 was allowed to pass through the gas gates 251 to 256, n-type layer forming vacuum chamber 203, the MW i-type layer forming vacuum changer 201, and the p-type layer forming vacuum chamber 206 to reach the substrate winding chamber 207. Then, the tension was adjusted to eliminate slack in the elongated substrate 250. Then, the substrate feeding chamber 202, n-type layer forming vacuum chamber 203, MW i-type layer forming vacuum chamber 201, p-type layer forming vacuum chamber 206, and the substrate winding chamber 207 were exhausted to a level of 5×10$^{-6}$ Torr or lower by a vacuum exhausting system (not shown) comprising an oil diffusion pump, a mechanical booster pump, and a rotary pump.

While operating the vacuum exhausting system, the raw material gas for the deposited film was, under conditions similar to those shown in Table 8, introduced into the discharge chamber 213 through the gas introduction pipes 208; the raw material gas for the deposited film was, under conditions shown in Table 2, introduced into the discharge chamber 214 through the gas introduction pipe 209; and the raw material gas for the deposited film was, under conditions shown in Table 5, introduced into the discharge chamber 217 through the gas introduction pipe 212. Simultaneously, hydrogen gas as gate gas was supplied to gas gates 251, 252, 255, and 256 through the corresponding gas gate supply pipes (not shown) at a flow rate of 500 sccm. In the thus-realized state, the exhaust conditions of the vacuum exhausting system were adjusted to maintain the internal pressure of the discharge chamber 213 at 5 mTorr and that of each of the discharge chambers 214 and 217 at 1.2 Torr.

After the pressure in each of the discharge chambers 213, 214, and 217 had been stabilized, the movement of the elongated substrate 250 from the substrate feeding chamber 202 to the substrate winding chamber 207 was started at a substrate moving speed of 100 cm/minute. While moving the elongated substrate 250, the infrared-ray lamp heater 220 was turned on to heat the elongated substrate 250 immediately before entering the inlet of the discharge chamber 213. Cold water was allowed to flow to the cooling rollers 225 so that the elongated substrate 250 was cooled immediately after passing through the discharge chamber 202.

By adjusting the substrate temperature of the MW i-type layer to be higher than that of the n-type layer and the p-type layer by 50° C. and by adjusting the lamp heaters and the flow rate of cooling water similarly to Example 2, the temperature gradients between the thermocouples 226 and 227 and between the thermocouples 228 and 229 were made to be 10 degree/second. The conditions were changed within the range shown in Table 8 to change the deposition speed to 0.5 nm/second to 25 nm/second. Furthermore, the moving speed of the elongated substrate 250 and the length of the discharging chamber were adjusted to make the thickness of the deposited film to be the same.

Then, the discharge electrodes in the discharge chambers 214 and 217 were supplied with high frequency electric power having a frequency of 13.56 MHz from high frequency power sources so that glow discharge was caused to take place in the discharge chambers 214 and 217. Microwave electric power having a frequency of 2.45 GHz was supplied to each window 230 in the discharge chamber 213 through the wave guide pipe 231 from the microwave power source 232 to cause microwave glow discharge to take place in the discharge chamber 213. Thus, semiconductors 403 to 407 having p-i-n junction as shown in FIG. 9 were formed on the elongated substrate 250 for 10 minutes by sequentially forming an n-type semiconductor in the n-type layer forming vacuum chamber 203, an MW i-type semiconductor in the i-type layer forming vacuum chamber 201, and a p-type semiconductor in the p-type layer forming vacuum chamber 206.

After the semiconductors 403 to 407 had been formed on the elongated substrate 250, the elongated substrate 250 was cooled and then it was taken out from the continuous deposited film forming apparatus. Furthermore, the transparent electrode (not shown) and the collecting electrode (not shown) were further formed on the p-type semiconductor layer 407 so that an elongated photoelectric conversion device was manufactured.

Then, a continuous module forming apparatus (not shown) was used to form the manufactured solar cells into a plurality of solar cell modules each having a size 36 cm×22 cm. By using pseudo sun light of Am 1.5 and 100 mW/cm$^2$, the characteristics were evaluated to examine the relationship between the deposition speed of the i-type semiconductor layer 405 and the characteristics.

The results are shown in Table 10.

As can be understood from the results, by heating and cooling performed at a rate of temperature change of 4° C./second or higher before and after forming the i-type semiconductor layer and further raising the deposition speed to shorten the heating time, the diffusion of impurities into the i-type semiconductor causing deterioration of the characteristics of the solar cell can be prevented. It can be understood that deterioration of the characteristics of the solar cell due to the deterioration in the quality of the i-type semiconductor film can be prevented by not raising the deposition speed excessively,

EXAMPLE 5

Figure 3:
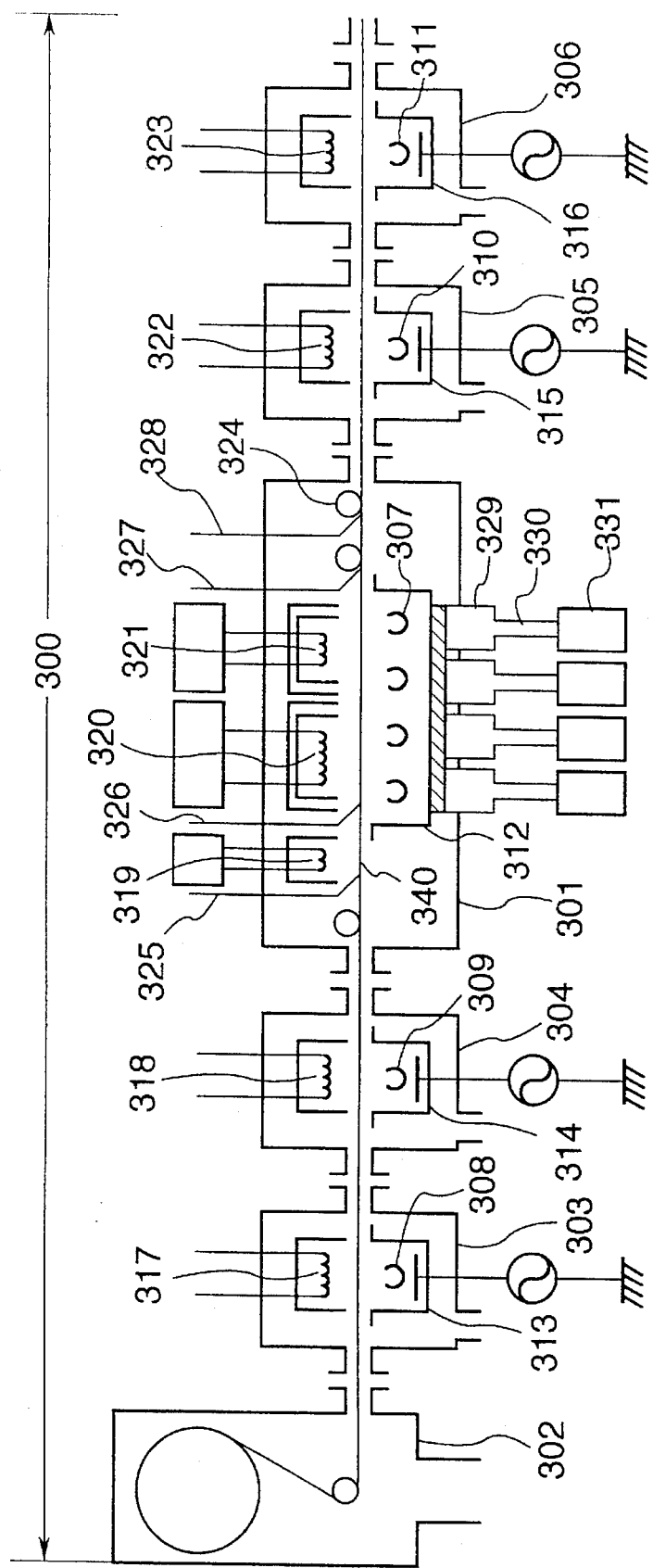
FIG. 3 is a schematic view showing one unit of an apparatus for forming a deposited film according to another embodiment of the present invention which is used to construct the apparatus together with units as shown in FIGS. 4 and 5.
Figure 4:
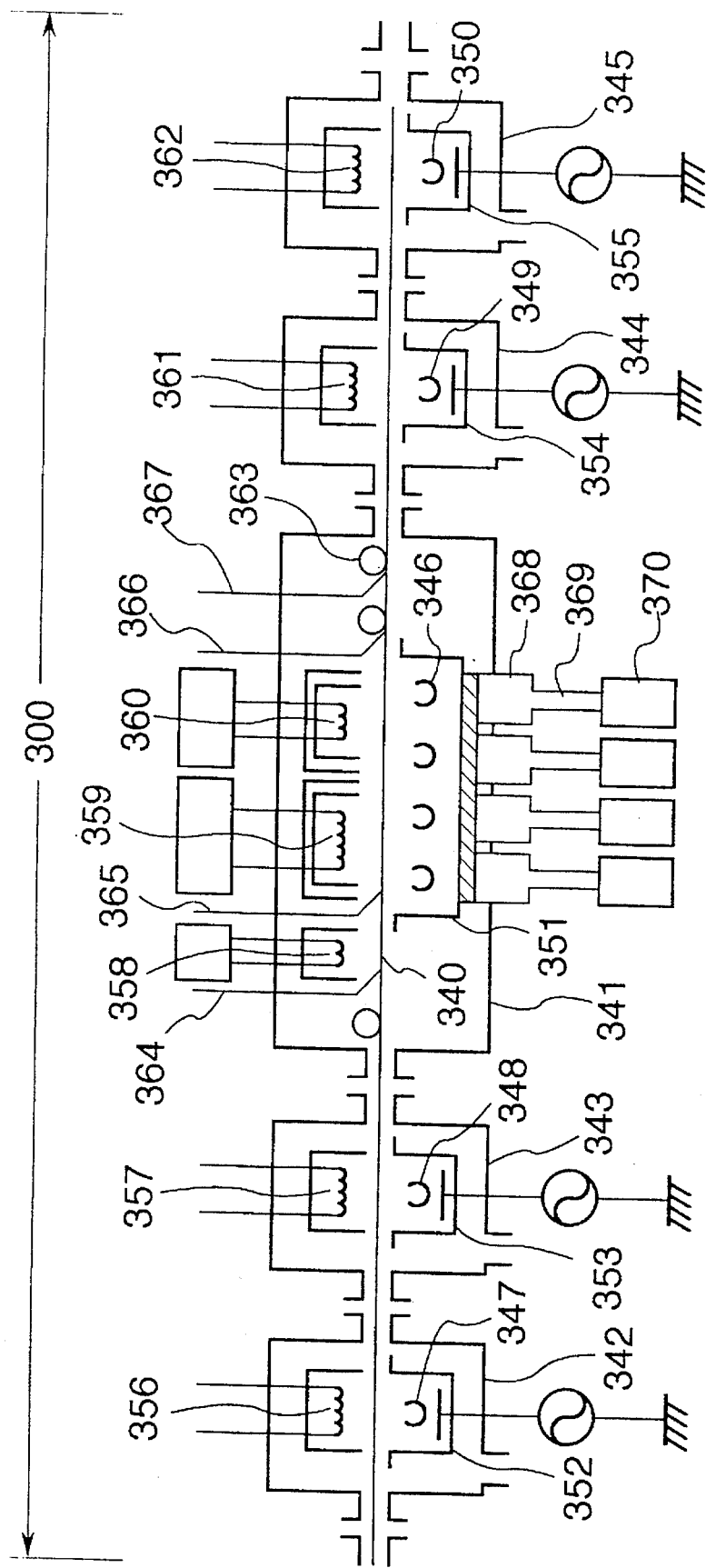
FIG. 4 is a schematic view showing one unit of the apparatus for forming a deposited film according to the embodiment of the present invention which is used to construct the apparatus together with units as shown in FIGS. 3 and 5.
Figure 5:
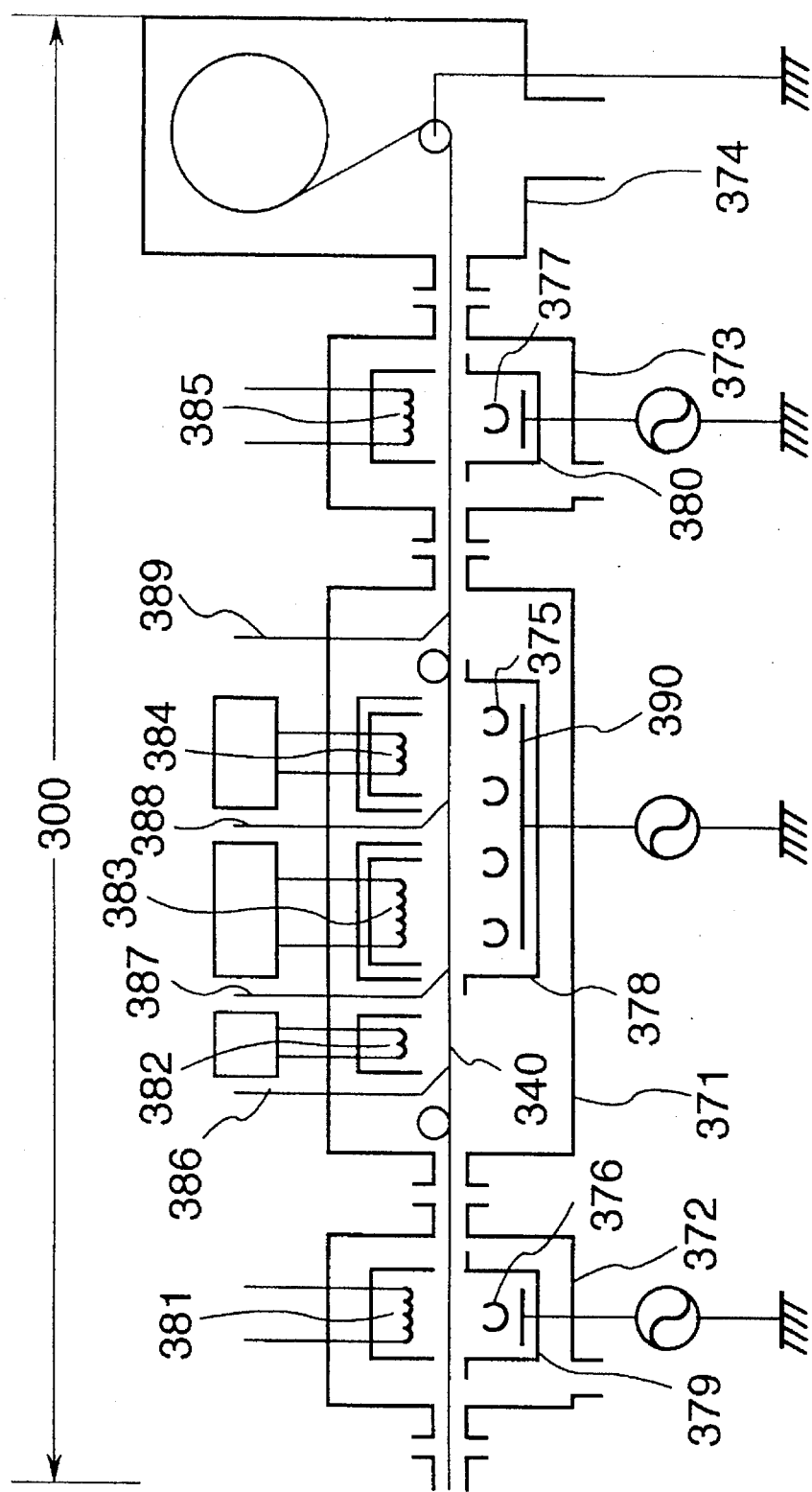
FIG. 5 is a schematic view showing one unit of the apparatus for forming a deposited film according to the embodiment of the present invention which is used to construct the apparatus together with units as shown in FIGS. 3 and 4.

Similarly to Example 3, a photovoltaic device was manufactured by using the deposited film forming apparatus 300 for forming a triple cell shown in FIGS. 3, 4, and 5 and according to the following procedure.

Similarly to Example 3, an elongated substrate 340 (having a width of 40 cm, length of 200 m, and a thickness of 0.125 mm) made of stainless steel (SUS430BA) was sufficiently degreased, cleaned, and placed in a continuous sputtering apparatus (not shown). Then, a silver electrode (purity: 99.99%) was used as a target and a silver thin film having a thickness of 100 nm was deposited by sputtering. Then, an ZnO electrode (purity: 99.999%) was used as a target and a ZnO thin film having a thickness of 1.2 μm was deposited on the silver thin film by sputtering. Thus, a lower electrode was formed on the elongated substrate 340.

Then, a bobbin, around which the elongated substrate 340 was wound, was installed in substrate feeding chamber 302 shown in FIG. 3, and the elongated substrate 340 was allowed to pass through the introduction side gas gate, n-type layer forming vacuum chamber 303 for the bottom cell, the i-type layer forming vacuum chamber 304, 301, and 305 for the bottom cell, p-type layer forming vacuum chamber 306 for the bottom cell (shown in FIG. 3), the n-type layer forming vacuum chamber 342 for the middle cell, the i-type layer forming vacuum chambers 343, 341, and 344 for the middle cell, the p-type layer forming vacuum chamber 345 for the middle cell (shown in FIG. 4), the n-type layer forming vacuum chamber 372 for the top cell, the i-type layer forming vacuum chamber 371 for the top cell, the p-type layer forming vacuum chamber 373 for the top cell and the outlet side gas gate shown in FIG. 5 to reach the substrate winding chamber 374. Then, the tension was adjusted to eliminate slack in the elongated substrate 340. Then, the substrate feeding chamber 302, the n-type layer forming vacuum chambers 303, 342, and 372, the i-type layer forming vacuum chambers 304, 301, 305, 343, 341, 344 and 371, the p-type layer forming vacuum chambers 306, 345, and 373, and the substrate winding chamber 374 were exhausted to a level of 5×10$^{-6}$ Torr or lower by a vacuum exhausting system (not shown) comprising an oil diffusion pump, a mechanical booster pump, and a rotary pump.

While operating the vacuum exhausting system, the raw material gas for the deposited film was, similarly to the conditions shown in Table 1, introduced into the discharge chambers 312 and 351 through the gas introduction pipes 307 and 346; the raw material gas for the deposited film was, under conditions shown in Table 2, introduced into the discharge chambers 313, 352, and 379 through the gas introduction pipes 308, 347 and 376; the raw material gas for the deposited film was, under conditions shown in Table 3, introduced into the discharge chambers 314, 353, and 378 through the gas introduction pipes 309, 348, and 375; the raw material gas for the deposited film was, under conditions shown in Table 4, introduced into the discharge chambers 315 and 354 through the gas introduction pipes 310 and 349 and; the raw material gas for the deposited film was, under conditions shown in Table 5, introduced into the discharge chambers 316, 355, and 360 through the gas introduction pipes 311, 350, and 377. Simultaneously, hydrogen gas as gate gas was supplied to gas gates at a flow rate of 500 sccm through the gate gas supply pipes (not shown). In the thus-realized state, the exhaust conditions of the vacuum system were adjusted to maintain the internal pressure of the discharge chambers 312 and 351 at 5 mTorr and that in each of the discharge chambers 313, 314, 315, 316, 352, 353, 354, 355, 378, 379, and 380 at 1.2 Torr.

After the pressure in each of the discharge chambers 312, 313, 314, 315, 316, 351, 352, 353, 354, 355, 378, 379, and 380 had been stabilized, the movement of the elongated substrate 340 from the substrate feeding chamber 302 to the substrate winding chamber 374 was started at the substrate moving speed of 100 cm/minute. While moving the elongated substrate 340, the infrared-ray lamp heaters 317, 318, 319, 320, 321, 322, 323, 356, 357, 358, 359, 360, 361, 362, 381, 382, 383, 384, and 385 were turned on. The, the elongated substrate 340 was heated by the heater 320 immediately before the inlets of the discharge chambers 312 and 351. Cold water was allowed to flow to the cooling rollers 324 and 363 so that the elongated substrate 340 was cooled immediately after exiting the discharge chambers 312 and 351.

By adjusting the substrate temperature during formation of the MW i-type layer to be higher than the substrate temperature during formation of the RF i-type layer by 50° C. and by adjusting the lamp heaters and the flow rates of cooling water, the temperature gradients between the thermocouples 325 and 326, between the thermocouples 364 and 365, between the thermocouples 327 and 328 and between the thermocouples 366 and 367 were made to be 4° C./second or more. The moving speed of the elongated substrate 340 and the length of the discharge chamber were adjusted to make the deposition speed of the i-type layer semiconductor 10 nm/second.

To make the photoelectric currents generated by respective cells 411, 412, and 413 to be the same when light is made incident upon the photovoltaic device shown in FIG. 10, the lengths of the discharge chambers 312, 351, and 378 were adjusted.

At this time, the thermocouples 325, 326, 364, 365, 327, 328, 366, and 367 disposed in the vacuum chambers 301 and 341 in contact with the reverse side of the moving elongated substrate 340 measured the temperatures of the substrate 340 at predetermined positions in the direction in which the substrate 340 was moved. Thus, the moving speed of the elongated substrate 340 was used to obtain the change rate of the substrate temperature per unit time immediately before and immediately after the discharge chambers 312 and 351.

Then, the discharge electrodes in the discharge chambers 313, 314, 315, 316, 352, 353, 354, 355, 378, 379, and 380 were supplied with high frequency electric power having a frequency of 13.56 MHz from high frequency power sources so that glow discharge was caused to take place in the discharge chambers 313, 314, 315, 316, 352, 353, 354, 355, 378, 379, and 380. Microwave electric power having a frequency of 2.45 GHz, was supplied to windows 329 and 368 in the discharge chambers 312 and 351 through the wave guide pipes 330 and 369 from the microwave power sources 331 and 370 to cause microwave glow discharge to take place in the discharge chambers 312 and 351. Thus, three sets of semiconductor layers 403–407 having p-i-n junctions as shown in FIG. 10 were formed on the elongated substrate 340 for 10 minutes by sequentially forming the n-type semiconductors in the n-type layer forming vacuum chambers 303, 340 and 372, the i-type semiconductors in the i-type layer forming vacuum chambers 301, 304, 305, 341, 343, 344, and 371, and the p-type semiconductors in the p-type layer forming vacuum chambers 306, 345, and 373.

After the semiconductors 403 to 407 had been formed on the elongated substrate 340, the elongated substrate 340 was cooled and then it was taken out from the continuous deposited film forming apparatus. Furthermore, the transparent electrode 408 and the collecting electrode 409 were formed on the p-type semiconductor so that the solar cell which was an elongated photoelectric conversion device was manufactured.

Then, a continuous module forming apparatus (not shown) was used to form the manufactured solar cells into a plurality of solar cell modules each having a size 36 cm×22 cm. By using pseudo sun light of AM 1.5 and 100 mW/cm$^2$, the characteristics were evaluated to examine the relationship between the change rate of the substrate temperature and the characteristics immediately before and immediately after the discharging chambers 312 and 351.

The results are shown in Table 11.

As can be understood from the results, by heating and cooling performed at a rate of temperature change of 4° C./second or higher before and after forming the i-type semiconductor layer, the diffusion of impurities into the i-type semiconductor layer can be prevented. As the result, excellent characteristics of the solar cell were obtained.

EXAMPLE 6

Similarly to Example 4, a photovoltaic device was manufactured by using the deposited film forming apparatus 200 shown in FIG. 2 according to the following procedure.

Initially, similarly to Example 1, an elongated substrate 250 (having a width of 40 cm, length of 200 m, and a thickness of 0.125 mm) made of stainless steel (SUS430BA) was sufficiently degreased, cleaned, and placed in a continuous sputtering apparatus (not shown). Then, a silver electrode (purity: 99.99%) was used as a target and a silver thin film having a thickness of 100 nm was deposited thereon by sputtering. Then, an ZnO electrode (purity: 99.999%) was used as a target and a ZnO thin film having a thickness of 1.2 μm was deposited on the silver thin film by sputtering. Thus, a lower electrode was formed on the elongated substrate 250.

Then, a bobbin, around which the elongated substrate 250 was wound, was placed in a substrate feeding chamber 202, and the elongated substrate 250 was allowed to pass through the gas gates 251 to 256, n-type layer forming vacuum chamber 203, the MW i-type layer forming vacuum chamber 201, and the p-type layer forming vacuum chamber 206 to reach the substrate winding chamber 207. Then, the tension was adjusted to eliminate slack in the elongated substrate 250. Then, the substrate feeding chamber 202, n-type layer forming vacuum chamber 203, i-type layer forming vacuum chamber 201, p-type layer forming vacuum chamber 206, and the substrate winding chamber 207 were exhausted to a level of 5×10$^{-6}$ Torr or lower by a vacuum exhausting system (not shown) comprising an oil diffusion pump, mechanical booster pump, and a rotary pump.

While operating the vacuum exhausting system, the raw material gas for the deposited film was, under conditions similar to those shown in Table 8, introduced into the discharge chamber 213 through the gas introduction pipes 208; the raw material gas for the deposited film was, under conditions shown in Table 2, introduced into the discharge chamber 214 through the gas introduction pipe 209; and the raw material gas for the deposited film was, under conditions shown in Table 5, introduced into the discharge chamber 217 through the gas introduction pipe 212. Simultaneously, hydrogen gas as gate gas was supplied to gas gates 251, 252, 255, and 256 through the corresponding gas gate supply pipes (not shown) at a flow rate of 500 sccm. In the thus-realized state, the exhaust conditions of the vacuum exhausting system were adjusted to maintain the pressure in the discharge chamber 213 at 5 mTorr and that in each of the discharge chambers 214 and 217 at 1.2 Torr.

After the pressure in each of the discharge chambers 213, 214, and 217 had been stabilized, the movement of the elongated substrate 250 from the substrate feeding chamber 202 to the substrate winding chamber 207 was started at a substrate moving speed of 100 cm/minute. While moving the elongated substrate 250, the infrared-ray lamp heater 220 was turned on to heat the elongated substrate 250 immediately before the inlet of the discharge chamber 213. Cold water was allowed to flow to the cooling rollers 225 so that the elongated substrate 250 was cooled immediately after the discharge chamber 202.

By adjusting the lamp heater and the flow rate of cooling water similarly to Example 2, the temperature gradients between the thermocouples 226 and 227 and between the thermocouples 228 and 229 were made to be 10 degrees/second. The difference between the substrate temperature during formation of the n-type semiconductor and the i-type semiconductor and between the substrate temperature during formation of the i-type semiconductor and the p-type semiconductor were in the range of 5° C. to 400° C. By changing the conditions within the range shown in FIG. 8, the deposition speed was made to be 5 nm/second. Furthermore, the moving speed of the elongated substrate 250 and the length of the discharge chamber were adjusted to make the thickness of the deposited film to be the same.

Then, the discharge electrodes in the discharge chambers 214 and 217 were supplied with high frequency electric power having a frequency of 13.56 MHz from high frequency power sources so that glow discharge was caused to take place in the discharge chambers 214 and 217. Microwave electric power having a frequency of 2.45 GHz was supplied to each window 230 in the discharge chamber 213 through the wave guide pipe 231 from the microwave power source 232 to cause microwave glow discharge to take place in the discharge chamber 213. Thus, semiconductors 403 to 407 having p-i-n junctions as shown in FIG. 9 were formed on the elongated substrate 250 for 10 minutes by sequentially forming an n-type semiconductor in the n-type layer forming vacuum chamber 203, an i-type semiconductor in the i-type layer forming vacuum chamber 201, and a p-type semiconductor in the p-type layer forming vacuum chamber 206.

After the semiconductors 403 to 407 had been formed on the elongated substrate 250, the elongated substrate 250 was cooled and taken out from the continuous deposited film forming apparatus. Furthermore, the transparent electrode (not shown) and the collecting electrode (not shown) were formed on the p-type semiconductor 407 so that an elongated solar cell was manufactured.

Then, a continuous module forming apparatus (not shown) was used to form the manufactured solar cells into a multiplicity of solar cell modules each having a size 36 cm×22 cm. By using pseudo sun light of AM 1.5 and 100 mW/cm$^2$, the characteristics were evaluated to examine the relationship between the deposition speed and the characteristics of the i-type semiconductor 405.

The results are shown in Table 12.

As can be understood from the results, by heating and cooling performed at a rate of the temperature change of 4° C./second or higher before and after forming the i-type semiconductor layer and by setting the difference between the substrate temperature before and after the forming at 10° C. or more, doping of phosphorus atoms into the n-layer and boron atoms into the p-layer can be performed efficiently. If the difference is 300° C. or less, diffusion of phosphorous in the n-layer and boron atoms in the p-layer into the i-layer cannot be prevented. In this case, the characteristics of the solar cell deteriorate.

Comparative Example 1

Similarly to Example 5, a photovoltaic device was manufactured by using the deposited film forming apparatus 300 shown in FIGS. 3, 4, and 5 according to the following procedure.

A silver thin film and a ZnO thin film were formed on an elongated substrate 340 made of stainless steel (SUS430BA) similarly to Example 3 whereby a lower electrode was formed.

Then, a bobbin, around which the elongated substrate 340 was wound, was placed in a substrate feeding chamber 302, and the elongated substrate 340 was, similarly to Example 5, allowed to pass to reach the substrate winding chamber 374. Then, the tension was adjusted to eliminate slack in the elongated substrate 340. Then, the substrate feeding chamber 302, the n-type layer forming vacuum chambers 303, 342, and 372, the i-type layer forming vacuum chambers 304, 301, 305, 343, 341, 344, and 371, the p-type layer forming vacuum chambers 306, 345, and 373, and the substrate winding chamber 374 were exhausted to a level of 5×10$^{-6}$ Torr or lower by a vacuum exhausting system (not shown) comprising an oil diffusion pump, a mechanical booster pump, and a rotary pump.

While operating the vacuum exhausting system, and similarly to Example 5, the raw material gas for the deposited film was, under the same conditions shown in Table 1, introduced into the discharge chambers 312 and 351 through the gas introduction pipes 307 and 346; the raw material gas for the deposited film was, under conditions shown in Table 2, introduced into the discharge chambers 313, 352, and 379 through the gas introduction pipes 308, 347 and 376; the raw material gas for the deposited film was, under conditions shown in Table 3, introduced into the discharge chambers 314, 353, and 378 through the gas introduction pipes 309, 348, and 375; the raw material gas for the deposited film was, under conditions shown in Table 4, introduced into the discharge chambers 315 and 354 through the gas introduction pipes 310 and 349; and the raw material gas for the deposited film was, under conditions shown in Table 5, introduced into the discharge chambers 316, 355, and 380 through the gas introduction pipes 311, 350, and 377. Simultaneously, hydrogen gas as gate gas was supplied to the gas gates at a flow rate of 500 sccm through the gate gas supply pipes (not shown). In the thus-realized state, the exhaust conditions of the vacuum exhausting system were adjusted to maintain the pressure in the discharge chambers 312 and 351 at 5 mTorr and that in each of the discharge chambers 313, 314, 315, 316, 352, 353, 354, 355, 378, 379, and 380 at 1.2 Torr.

After the pressure in each of the discharge chambers 312, 313, 314, 315, 316, 351, 352, 353, 354, 355, 378, 379, and 380 had been stabilized, the movement of the elongated substrate 340 was started at a moving speed of 100 cm/minute. Then, the infrared-ray lamp heaters were turned on to heat the elongated substrate 340 immediately before the inlets of the discharge chambers 312 and 351. Cold water was allowed to flow to the cooling rollers 324 and 363 so that the elongated substrate 340 was cooled immediately after the discharge chambers 312 and 351.

By adjusting the lamp heaters and the flow rate of cooling water, the temperature gradient among the thermocouples 325, 326, 364, and 365 and among the thermocouples 327, 328, 366, and 367 was made to be 4° C./second or less. To make the deposition speed of the i-type semiconductor to be 10 nm/sec, the moving speed of the elongated substrate 340 and the length of the discharge chamber in each vacuum chamber were adjusted.

To make photoelectric currents generated by respective cells 411, 412, and 413 to be the same when light is made incident upon the photovoltaic device shown in FIG. 10, the lengths of the discharge chambers 312, 51, and 378 were adjusted.

At this time, the thermocouples 325, 326, 364, 365, 327, 328, 366, and 367 disposed in the vacuum chambers 301 and 341 in contact with the reverse side of the moving elongated substrate 340 measured the temperatures of the substrate 340 at predetermined positions in the direction in which the substrate 340 was moved. Thus, the moving speed of the elongated substrate 340 was used to obtain the change rate of the substrate temperature per unit time immediately before and immediately after the discharge chambers 312 and 351.

Then, similarly to Example 5, high frequency electric power having a frequency of 13.56 MHz was supplied from the high frequency power source so that glow discharge was caused to take place in the discharge chambers 313, 314, 315, 316, 352, 353, 354, 355, 378, 379, and 380. Microwave electric power having a frequency of 2.45 GHz was supplied to windows through the wave guide pipes from the microwave power sources to cause microwave glow discharge to take place in the discharge chambers 312 and 351.

The semiconductors 411 to 413 having p-i-n junctions therein shown in FIG. 10 were formed on the elongated substrate 340 for 10 minutes.

After the semiconductors 411 to 413 had been formed on the elongated substrate 340, the elongated substrate 340 was cooled and removed from the continuous deposited film forming apparatus. Furthermore, the transparent electrode 408 and the collecting electrode 409 were formed on the p-type semiconductor 407 so that an elongated solar cell was manufactured.

Then, similarly to Example 5, a continuous module forming apparatus (not shown) was used to form the manufactured solar cells into solar cell modules. By using pseudo sun light of AM 1.5 and 100 mW/cm$^2$, the characteristics were evaluated to examine the relationship between the change rate of the substrate temperature per unit time and the characteristics immediately before and immediately after the discharge chambers 312 and 351.

The results are shown in Tables 13 and 14.

As can be understood from the results, heating and cooling performed at a rate of temperature change of not higher than 4° C./second before and after forming the i-type semiconductor layers resulted in the diffusion of impurities into the i-type semiconductor layers. In this case, excellent characteristics of the solar cell cannot be obtained.

As described above, according to the present invention, there is provided a process for forming a deposited film by plasma CVD so as to continuously form a deposited film on an elongated substrate in a vacuum chamber, which comprises heating the substrate immediately before an inlet of a glow discharge region in the vacuum chamber at a rate of 4° C./second or higher and while cooling said substrate at a rate of 4° C./second or higher immediately after an outlet of the glow discharge region while continuously moving the substrate in a lengthwise direction of the substrate in the vacuum chamber and forming a semiconductor layer on the substrate at a deposition speed of 0.1 nm/second to 20 nm/second by plasma CVD. As a result, the semiconductor can be protected from annealing and a solar cell exhibiting excellent conversion efficiency can be formed continuously on a substrate having a larger area without nonuniformity.

TABLE 1

| Raw Material Gas | SiH$_4$: 500 sccm |
| --- | --- |
| | GeH$_4$: 200 sccm |
| | H$_2$: 800 sccm |
| Microwave Electric power | 500 W |
| Position at which the temperature of substrate is measured at the time of moving the substrate | Thermocouple 126 (in the vicinity of the inlet of the discharge chamber) |
| | Thermocouple 127 (immediately before the discharge chamber) |
| | Thermocouple 128 (immediately after the discharge chamber) |
| | Thermocouple 129 (in the vicinity of the outlet of the discharge chamber) |

TABLE 2

| Raw material gas | SiH$_4$: 200 sccm |
| --- | --- |
| | H$_2$: 400 sccm |
| High frequency electric power | 400 W |
| Substrate Temperature in Discharge Chamber | 300° C. (constant) |
| Pressure in Discharge Chamber | 1.1 Torr |

TABLE 3

| Raw material gas | SiH$_4$: 200 sccm |
| --- | --- |
| | H$_2$: 400 sccm |
| High frequency electric power | 400 W |
| Substrate Temperature in Discharge Chamber | 300° C. (constant) |
| Pressure in Discharge Chamber | 1.1 Torr |

TABLE 4

| Raw material gas | SiH$_4$: 200 sccm |
| --- | --- |
| | H$_2$: 400 sccm |
| High frequency electric power | 400 W |
| Substrate Temperature in Discharge Chamber | 300° C. (constant) |
| Pressure in Discharge Chamber | 1.1 Torr |

TABLE 5

| Raw material gas | SiH$_4$: 25 sccm |
| --- | --- |
| | BF$_3$: 1 sccm |
| | H$_2$: 900 sccm |
| High frequency electric power | 700 W |
| Substrate Temperature in Discharge Chamber | 220° C. (constant) |
| Pressure in Discharge Chamber | 1.1 Torr |

TABLE 6

| | *1 | | | | | | | |
| --- | --- | --- | --- | --- | --- | --- | --- | --- |
| *2 | 1.0 | 2.0 | 3.0 | 4.0 | 5.0 | 10.0 | 20.0 | 50.0 |
| 1.0 | D | D | D | D | D | D | D | D |
| 2.0 | D | D | D | D | C | C | C | C |
| 3.0 | D | D | C | B | B | B | B | B |
| 4.0 | D | D | C | A | A | A | A | A |
| 5.0 | D | B | B | A | A | A | A | A |
| 10.0 | D | C | B | A | A | A | A | A |
| 20.0 | D | C | B | A | A | A | A | A |
| 50.0 | D | B | B | A | A | A | A | A |

*1 Temperature gradient from RF i-type semiconductor 404 to MW i-type semiconductor 405 (*C./second)
*2 Temperature gradient from MW i-type semiconductor 405 to RF i-type semiconductor 406 (*C./second)

As for the half value (film thickness) of the content of dopant in a doped layer (sandwiching the MW i-layer) evaluated with SIMS, assuming the point of *1: 50° C./sec and *2: 50° C./sec to be 1, results of 0.9 or higher were given the symbol A, results of 0.8 up to 0.9 were given the symbol B, results of 0.5 up to 0.8 were given the symbol C, and results not higher than 0.5 were given the symbol D.

TABLE 7

| | *3 | | | | | | | |
| --- | --- | --- | --- | --- | --- | --- | --- | --- |
| *4 | 1.0 | 2.0 | 3.0 | 4.0 | 5.0 | 10.0 | 20.0 | 50.0 |
| 1.0 | D | D | D | D | D | D | D | D |
| 2.0 | D | D | D | D | D | D | D | C |
| 3.0 | D | D | D | C | C | B | B | B |
| 4.0 | D | D | C | A | A | A | A | A |
| 5.0 | D | D | C | A | A | A | A | A |
| 10.0 | D | D | C | A | A | A | A | A |

TABLE 7-continued

| | | | | *3 | | | | | |
|---|---|---|---|---|---|---|---|---|---|
| *4 | 1.0 | 2.0 | 3.0 | 4.0 | 5.0 | 10.0 | 20.0 | 50.0 |
| 20.0 | D | D | B | A | A | A | A | A |
| 50.0 | D | D | B | A | A | A | A | A |

*3 Temperature gradient from n-type semiconductor 403 to MW i-type semiconductor 405 (*C./second)
*4 Temperature gradient from MW i-type semiconductor 405 to p-type semiconductor 407 (*C./second)

As for the half value (film thickness) of the content of dopant in a doped layer (sandwiching the MW i-layer) evaluated with SIMS, assuming the point of *3: 50° C./sec and *4: 50° C./sec to be 1, results of 0.9 or higher were given the symbol A, results of 0.8 up to 0.9 were given the symbol B, results of 0.5 up to 0.8 were given the symbol C, and results not higher than 0.5 were given the symbol D.

TABLE 8

| Raw material gas | $SiH_4$: 50 to 500 sccm |
|---|---|
| | $GeH_4$: 20 to 200 sccm |
| | $H_2$: 300 to 800 sccm |
| Microwave Electric Power | 300 to 500 W |

TABLE 9

| Deposition Rate of i-type Semiconductor (nm/sec) | Characteristics |
|---|---|
| 0.5 | D |
| 0.8 | C |
| 1.0 | A |
| 5.0 | A |
| 20.0 | A |
| 22.0 | C |
| 25.0 | D | where assigning the characteristics at a deposition rate of 20.0 nm/sec (practically acceptable limit of characteristics having Isc, Voc and F.F. that are not too low) a value of 1, results of 1 or higher were given the symbol A, results between 0.7 and 1 were given the symbol B, results not higher than 0.7 were given the symbol C, and results of 0.5 or lower were given the symbol D.

TABLE 10

| Deposition Rate of i-type Semiconductor (nm/sec) | Characteristics |
|---|---|
| 0.5 | D |
| 0.8 | B |
| 1.0 | A |
| 5.0 | A |
| 20.0 | A |
| 22.0 | D |
| 25.0 | D | where assigning the characteristics at a deposition rate of 20.0 nm/sec (practically acceptable limit of characteristics) a value of 1, results of 1 or higher were given the symbol A, results between 0.7 and 1 were given the symbol B, results not higher than 0.7 were given the symbol C, and results of 0.5 or lower were given the symbol D.

TABLE 11

| | | | *1 | | |
|---|---|---|---|---|---|
| *2 | 4.0 | 5.0 | 10.0 | 20.0 | 50.0 |
| 4.0 | A | A | A | A | A |
| 5.0 | A | A | A | A | A |
| 10.0 | A | A | A | A | A |
| 20.0 | A | A | A | A | A |
| 50.0 | A | A | A | A | A |

*1 Temperature gradient from RF i-type semiconductor 404 to MW i-type semiconductor 405 (°C./second)
*2 Temperature gradient from MW i-type semiconductor 405 to RF i-type semiconductor 406 (°C./second)

where assigning the characteristics at a change rate of the substrate temperature of 4.0 (°C./sec)/4.0 (°C./sec) (practically acceptable limit of characteristics) a value of 1, results of 1 or higher were given the symbol A.

TABLE 12

| | | | | *3 | | | | |
|---|---|---|---|---|---|---|---|---|
| *4 | 5 | 10 | 20 | 50 | 100 | 200 | 300 | 350 |
| 5 | C | C | C | C | C | C | C | D |
| 10 | B | A | A | A | A | A | A | D |
| 20 | B | A | A | A | A | A | A | D |
| 50 | B | A | A | A | A | A | A | D |
| 100 | B | A | A | A | A | A | A | D |
| 200 | B | A | A | A | A | A | A | D |
| 300 | B | A | A | A | A | A | A | D |
| 350 | D | D | D | D | D | D | D | D |

*3 Temperature gradient from n-type semiconductor 403 to MW i-type semiconductor 405 (°C./second)
*4 Temperature gradient from Mw i-type semiconductor 405 to p-type semiconductor 407 (°C./second)

where assigning the characteristics at a rate of change of the substrate temperature of 10 (°C./sec)/10 (°C./sec) (practically acceptable limit of characteristics) a value of 1, results of 1 or higher were given the symbol A, results between 0.7 and 1 were given the symbol B, results not higher than 0.7 were given the symbol C, and results not higher than 0.5 were given the symbol D.

TABLE 13

| | | | | *1 | | | | |
|---|---|---|---|---|---|---|---|---|
| *2 | 1.0 | 2.0 | 3.0 | 4.0 | 5.0 | 10.0 | 20.0 | 50.0 |
| 1.0 | D | D | D | D | D | D | D | D |
| 2.0 | D | D | D | D | D | D | D | D |
| 3.0 | D | D | D | D | D | C | C | D |

*1 Temperature gradient from RF i-type semiconductor 404 to MW i-type semiconductor 405 (°C./second)
*2 Temperature gradient from MW i-type semiconductor 405 to RF i-type semiconductor 406 (°C./second)

where assigning the characteristics at a change rate of substrate temperature of 4.0 (°C./sec)/4.0 (°C./sec) (practically acceptable limit of characteristics) a value of 1, results between 0.5 and 0.7 or higher were given the symbol C, and results not higher than 0.5 were given the symbol D.

TABLE 14

| | | | | *1 | | | | |
|---|---|---|---|---|---|---|---|---|
| *2 | 1.0 | 2.0 | 3.0 | 4.0 | 5.0 | 10.0 | 20.0 | 50.0 |
| 1.0 | D | D | D | D | D | D | D | D |
| 2.0 | D | D | D | D | D | D | D | D |

TABLE 14-continued

| | *1 | | | | | | | |
|---|---|---|---|---|---|---|---|---|
| *2 | 1.0 | 2.0 | 3.0 | 4.0 | 5.0 | 10.0 | 20.0 | 50.0 |
| 3.0 | D | D | D | D | C | C | C | C |

*1 Temperature gradient from RF i-type semiconductor 404 to MW i-type semiconductor 405 (°C./second)
*2 Temperature gradient from MW i-type semiconductor 405 to RF i-type semiconductor 406 (°C./second)

wherein assigning the characteristics at a change rate of substrate temperature of 4.0 (°/sec)/4.0 (°/sec) (practically acceptable limit of characteristics, a value of 1, results between 0.5 and 0.7 or higher were given the symbol C, and results not higher than 0.5 were given the symbol D.

What is claimed is:

1. A process for forming a deposited semiconductor film by glow discharge on a continuously moving belt-like substrate which has a first semiconductor layer deposited thereon, which comprises the steps of:

heating said moving substrate immediately before said substrate enters a glow discharge region;

forming said deposited semiconductor film on said moving substrate in said glow discharge region; and cooling said moving substrate after passing through said glow discharge region.

2. A process for forming a deposited film according to claim 1, further comprising a step of maintaining the temperature of said moving substrate in said glow discharge region.

3. A process for forming a deposited film according to claim 1, wherein said moving substrate is heated at a rate of 4° C./second or higher.

4. A process for forming a deposited film according to claim 1, wherein said moving substrate is cooled at a rate of 4° C./second or higher.

5. A process foe forming a deposited film according to claim 1, wherein said deposited film is deposited at a rate of 0.1 nm/second to 20 nm/second.

6. A process for forming a deposited film according to claim 1, wherein said glow discharge is caused by microwave plasma CVD.

7. A process for forming a deposited film according to claim 1, further comprising a step of forming a second semiconductor layer having a conductivity type different from said first semiconductor layer on said deposited film after said cooling step.

8. A process for forming a deposited film according to claim 10, wherein the first semiconductor layer has a first conductivity type.

9. A process for forming a deposited film according to claim 8, wherein the second semiconductor layer formed after the cooling step has a second conductivity type opposite to the first conductivity type of the first semiconductor layer.

10. A process for forming a deposited film according to claim 10, wherein the second semiconductor layer formed after the cooling step is an i-type semiconductor layer.

11. A process for forming a deposited film according to claim 10, wherein the i-type semiconductor layer is formed by high frequency plasma CVD.

12. A process for forming a deposited film according to claim 1, wherein said belt-like substrate is cooled by a flowing cooling medium.

13. A process for forming a deposited film according to claim 1, wherein said deposited film formed by glow discharge is an i-type semiconductor.

14. A process for forming a deposited film according to claim 13, wherein a raw material gas for forming the i-type semiconductor layer comprises a gasifiable compound which contains silicon atoms.

15. A process for forming a deposited film according to claim 14, wherein the raw material gas further comprises a compound which contains carbon atoms.

16. A process for forming a deposited film according to claim 14, wherein the raw material gas further comprises a compound which contains nitrogen atoms.

17. A process for forming a deposited film according to claim 14, wherein the raw material gas further comprises a compound which contains oxygen atoms.

18. A process for forming a deposited film according to claim 13, wherein a raw material gas for forming the i-type semiconductor layer comprises a gasifiable compound which contains germanium atoms.

19. A process for forming a deposited film according to claim 18, wherein the raw material gas further comprises a compound which contains carbon atoms.

20. A process for forming a deposited film according to claim 18, wherein the raw material gas further comprises a compound which contains nitrogen atoms.

21. A process for forming a deposited film according to claim 18, wherein the raw material gas further comprises a compound which contains oxygen atoms.

22. A process for forming a deposited film according to claim 1, wherein said steps are performed in a single apparatus.

23. A process for forming a deposited film according to claim 1, wherein the first semiconductor layer has a first conductivity type.

24. A process for forming a deposited film according to claim 17, wherein said first semiconductor layer of first conductivity type is formed by plasma CVD.

25. A process for forming a deposited film according to claim 24, wherein said plasma CVD is high frequency plasma CVD.

26. A process for forming a deposited film according to claim 23, wherein the difference between the moving substrate temperatures for forming said first semiconductor layer having said first conductivity type and for forming said deposited film by glow discharge is 10° C. or more.

27. A process for forming a deposited film according to claim 1, wherein the first semiconductor layer is an i-type semiconductor layer.

28. A process for forming a deposited film according to claim 27, wherein the i-type semiconductor layer is formed by high frequency plasma CVD.

29. A process for continuously forming a deposited semiconductor film on an elongated moving substrate by plasma CVD in a vacuum chambers which comprises the steps of continuously moving said substrate in a lengthwise direction in said vacuum chamber, while heating said moving substrate immediately before the inlet of a glow discharge region of said vacuum chamber at a rate of 4° C./second or higher, forming said semiconductor film on said moving substrate in said glow discharge region at a deposition rate of 0.1 nm/second to 20 nm/second by plasma CVD, and cooling said moving substrate at a rate of 4° C./second or higher immediately after the outlet of said glow discharge region.

30. An apparatus for continuously forming a deposited film on an elongated moving substrate, comprising a vacuum chamber for forming a semiconductor layer having p-type or n-type conductivity on said moving substrate and a vacuum chamber for forming a semiconductor having i-type conductivity on said semiconductor layer having p-type or n-type conductivity, which comprises heating means disposed immediately before said vacuum chamber for forming said semiconductor having i-type conductivity and cooling means disposed immediately after said vacuum chamber for forming said semiconductor having i-type conductivity.

31. An apparatus for continuously forming a deposited film according to claim 30, wherein the heating means comprises a halogen lamp.

32. An apparatus for continuously forming a deposited film according to claim 30, wherein the heating means comprises a heating block.

33. An apparatus for continuously forming a deposited film according to claim 32, wherein the heating block can be brought into contact with the substrate.

34. An apparatus for continuously forming a deposited film according to claim 30, wherein the heating means comprises a heating roller.

35. An apparatus for continuously forming a deposited film according to claim 34, wherein the heating roller can be brought into contact with the substrate.

36. An apparatus for continuously forming a deposited film according to claim 30, wherein the heating means comprises an apparatus for generating a hot gas plasma.

37. An apparatus for continuously forming a deposited film according to claim 30, wherein the heating means comprises an apparatus for generating an inductive heating by electromagnetic waves.

38. An apparatus for continuously forming a deposited film according to claim 30, wherein the cooling means comprises a cooling pipe which is disposed adjacent to the substrate and through which a cooling medium passes.

39. An apparatus for continuously forming a deposited film according to claim 30, wherein the cooling means comprises a cooling block.

40. An apparatus for continuously forming a deposited film according to claim 39, wherein the cooling block can be brought into contact with the substrate.

41. An apparatus for continuously forming a deposited film according to claim 30, wherein the cooling means comprises a cooling roller.

42. An apparatus for continuously forming a deposited film according to claim 41, wherein the cooling roller can be brought into contact with the substrate.

43. An apparatus for continuously forming a deposited film according to claim 30, wherein the cooling means comprises an apparatus for spraying a gas having a low temperature.

44. An apparatus for continuously forming a deposited film according to claim 30, wherein the cooling means comprises a mechanism for cooling by air.

45. A process for forming a deposited film comprising forming a semiconductor having i-type Conductivity on a moving semiconductor substrate having p-type or n-type conductivity by glow discharge, wherein said moving semiconductor substrate having p-type or n-type conductivity is heated at a rate of 4° C./second or higher before entering a region in which said glow discharge is performed.

46. A process for forming a deposited film which comprises the steps of:

forming a first semiconductor layer having p-type or n-type conductivity on a substrate, and forming an i-type semiconductor layer on said first semiconductor layer by microwave CVD, wherein the substrate on which the semiconductor layer having p-type or n-type conductivity is deposited is heated at a rate of 4° C./second or more before the step of forming the i-type semiconductor layer.

47. A process for forming a deposited film according to claim 46, wherein an i-type semiconductor layer is formed on said first semiconductor layer by high frequency plasma CVD between the step of forming the semiconductor layer having p-type or n -type conductivity and the step of forming the i-type semiconductor layer by microwave plasma CVD.

48. A process for forming a deposited film Which comprises the steps of:

forming an i-type semiconductor layer on a substrate by microwave CVD, and forming a second semiconductor layer on said i-type semiconductor layer having p-type or n-type conductivity, wherein the substrate on which the i-type semiconductor layer is deposited is cooled at a rate of 4° C./second or more after the step of forming the i-type semiconductor layer and before the step of forming the second semiconductor layer.

49. A process for forming a deposited film according to claim 48, wherein an i-type semiconductor layer is formed by high frequency plasma CVD between the step of forming the i-type semiconductor layer by microwave CVD and the step of forming the p-type or n-type semiconductor layer.

* * * * *

UNITED STATES PATENT AND TRADEMARK OFFICE
CERTIFICATE OF CORRECTION

PATENT NO. : 5,571,749

DATED : November 5, 1996

INVENTORS : KOICHI MATSUDA ET AL.

It is certified that error appears in the above-identified patent and that said Letters Patent is hereby corrected as shown below:

COLUMN 2

Line 20,   "conversing" should read --converting--;
   Line 46,   "PVSC," should read --PV SEC,--;
   Line 47,   "Solar" should read --Alloy Solar--.

COLUMN 3

Line 30,   "preventing" should read --prevent--.

COLUMN 6

Line 52,   "water" should read --water,--;
   Line 53,   "medium" should read --medium,--;
   Line 55,   "bring" should read --bringing--.

COLUMN 9

Line 4,    "by" should read --be--;
   Line 10,   "1130" should read --113.--.

UNITED STATES PATENT AND TRADEMARK OFFICE
CERTIFICATE OF CORRECTION

PATENT NO. : 5,571,749

DATED : November 5, 1996

INVENTORS : KOICHI MATSUDA ET AL.

It is certified that error appears in the above-identified patent and that said Letters Patent is hereby corrected as shown below:

COLUMN 10

Line 14,   "(n-side" should read --(n-side)--;
   Line 19,   "405," should read --405, and--.

COLUMN 14

Line 55,   "is a in a range" should read --is in a range--.

COLUMN 15

Line 39,   "$SiF_4$." should read --$SiF_4$,--;
   Line 49,   "$CO_2$," should read --$CO_2$,--.

COLUMN 16

Line 12,   "with" should read --which--.

COLUMN 22

Line 49,   "degree/second." should read --degrees/second.--.

COLUMN 23

Line 47,   "an" should read --a--;
   Line 57,   "chamber" should read --chambers--.

UNITED STATES PATENT AND TRADEMARK OFFICE
CERTIFICATE OF CORRECTION

PATENT NO.  : 5,571,749

DATED       : November 5, 1996

INVENTORS   : KOICHI MATSUDA ET AL.

It is certified that error appears in the above-identified patent and that said Letters Patent is hereby corrected as shown below:

COLUMN 24

Line 24,  "349" should read --349;--
   Line 25,  "and;" should read --and--.
   Line 43,  "The, the" should read --The--.

COLUMN 26

Line 1,   "an" should read --a--.

COLUMN 28

Line 46,  "51," should read --351,--.

COLUMN 33

Line 49,  "claim 10," should read --claim 7,--;
   Line 57,  "claim 10," should read --claim 7,--.

COLUMN 34

Line 34,  "claim 17," should read --claim 23,--;
   Line 52,  "chambers" should read --chamber,--.

UNITED STATES PATENT AND TRADEMARK OFFICE
CERTIFICATE OF CORRECTION

PATENT NO. : 5,571,749

DATED : November 5, 1996

INVENTORS : KOICHI MATSUDA ET AL.

It is certified that error appears in the above-identified patent and that said Letters Patent is hereby corrected as shown below:

<u>COLUMN 36</u>

Line 6, "Conductivity" should read --conductivity--;
Line 15, "substrate," should read --substrate;--;
Line 28, "Which" should read --which--;
Line 31, "CVD," should read --CVD;--.

Signed and Sealed this

Sixth Day of May, 1997

Attest:

BRUCE LEHMAN

*Attesting Officer*  Commissioner of Patents and Trademarks